United States Patent
Yoneda et al.

(10) Patent No.: US 8,017,528 B2
(45) Date of Patent: Sep. 13, 2011

(54) IMPURITY-ACTIVATING THERMAL PROCESS METHOD AND THERMAL PROCESS APPARATUS

(75) Inventors: Kenji Yoneda, Kyoto (JP); Kazuma Takahashi, Hyogo (JP)

(73) Assignee: Panasonic Corporation, Osaka (JP)

( * ) Notice: Subject to any disclaimer, the term of this patent is extended or adjusted under 35 U.S.C. 154(b) by 88 days.

(21) Appl. No.: 12/352,977

(22) Filed: Jan. 13, 2009

(65) Prior Publication Data

US 2009/0197427 A1    Aug. 6, 2009

(30) Foreign Application Priority Data

Feb. 6, 2008  (JP) ................................ 2008-026925

(51) Int. Cl.
  *H01L 21/00* (2006.01)
(52) U.S. Cl. ........ 438/799; 438/308; 438/530; 438/535; 438/542; 438/796; 438/798; 257/E21.471; 257/E21.475
(58) Field of Classification Search .................. 438/308, 438/530, 535, 542, 796, 798, 799; 257/E21.471, 257/E21.475
See application file for complete search history.

(56) References Cited

U.S. PATENT DOCUMENTS

| | | | | |
|---|---|---|---|---|
| 5,773,337 A | * | 6/1998 | Lee | ............................... 438/199 |
| 6,770,519 B2 | | 8/2004 | Ito et al. | |
| 7,026,205 B2 | | 4/2006 | Ito et al. | |
| 7,279,405 B2 | * | 10/2007 | Itani et al. | ...................... 438/530 |
| 7,598,162 B2 | * | 10/2009 | Yamamoto et al. | ........... 438/528 |
| 7,629,275 B2 | * | 12/2009 | Chen et al. | ..................... 438/799 |
| 2004/0018702 A1 | | 1/2004 | Ito et al. | |
| 2005/0062107 A1 | * | 3/2005 | Ito et al. | ........................ 257/355 |
| 2007/0108166 A1 | * | 5/2007 | Jennings et al. | ........... 219/121.8 |
| 2007/0173066 A1 | * | 7/2007 | Kokura et al. | ................. 438/715 |
| 2007/0215958 A1 | * | 9/2007 | Tanaka et al. | ................. 257/411 |

FOREIGN PATENT DOCUMENTS

JP          3699946          9/2005

* cited by examiner

*Primary Examiner* — Kevin M Picardat
*Assistant Examiner* — Bac Au
(74) *Attorney, Agent, or Firm* — McDermott Will & Emery LLP

(57) ABSTRACT

A thermal cycle includes: increasing a temperature from an initial temperature to a temperature T1 at an arbitrary rate R1 (° C./sec); holding the temperature at the temperature T1 for an arbitrary period t1 (sec); increasing the temperature from the temperature T1 to a temperature T2 at a rate R2 (° C./sec) of $1.0 \times 10^7$ (° C./sec) or less; and holding the temperature at the temperature T2 for a period t2 (sec) of 50 msec or less. The thermal cycle thereafter includes: decreasing the temperature from the temperature T2 to the temperature T1 at a rate R1' (° C./sec) of $1.0 \times 10^7$ (° C./sec) or less; holding the temperature T1 for an arbitrary period t3 (sec); and decreasing the temperature from the temperature T1 to a final temperature at an arbitrary rate R2' (° C./sec). Such a thermal cycle is successively repeated in a plurality of iterations.

11 Claims, 12 Drawing Sheets

IMPURITY-ACTIVATING THERMAL PROCESS METHOD AND THERMAL PROCESS APPARATUS

CROSS REFERENCE TO RELATED APPLICATION

This application claims priority under 35 U.S.C. §119 on Patent Application No. 2008-26925 filed in Japan on Feb. 6, 2008, the entire contents of which are hereby incorporated by reference.

BACKGROUND OF THE INVENTION

1. Field of the Invention

The present invention relates to a thermal process method in the field of semiconductor technology and, more particularly, to an impurity-activating thermal process method after impurity introduction.

2. Description of the Background Art

In recent years, devices have been downsized along with the increase in the degree of integration, functionality and speed of semiconductor integrated circuit devices. Accordingly, progress has been made not only with lateral miniaturization, e.g., a reduced gate length of a transistor, but also with vertical miniaturization, e.g., an ultra-thin gate insulating film. Particularly, in a transistor, the impurity diffusion in the lateral direction (channel direction) from a source/drain region and an extension region into a channel region and the impurity diffusion in the depth direction are severely restricted. This is because the short channel effect deteriorates if the impurity diffusion length in the channel direction of a transistor and the impurity diffusion depth in the depth direction thereof increase. On the other hand, there is also a demand for a reduction in resistance of these extension and source/drain regions, with the impurity diffusion length and the impurity diffusion depth being suppressed. This is because if the resistance of the extension region is reduced, the parasitic resistance from the source/drain region to the channel region is reduced, thereby obtaining a higher drive power.

Thus, there is a demand for the extension region to have a reduced resistance while suppressing the impurity diffusion length. While increasing the impurity concentration and performing a thermal process adequately are effective for obtaining a low resistance, they also lead to an increase in the impurity diffusion length. Therefore, the reduction in the diffusion length of the extension region and the reduction in the resistance thereof are in a trade-off relationship.

In order to solve this problem, an impurity introduction step employs a method in which the ion implantation energy is set to a very low level of 1 keV or less to thereby suppress the impurity introduction depth in a conventional impurity introduction process using an ion implantation method. As to the thermal process step (impurity-activating thermal process step), high-temperature, short annealing based on RTP (Rapid Thermal Processing) has been employed, instead of conventional long annealing using an electric furnace, as a way to improve the activation rate while suppressing the diffusion length. Particularly, in recent years, the impurity-activating thermal process step has been performed by a high-temperature, very short annealing called a "spike RTA", wherein the temperature-increasing/decreasing rate (Δt) is set to about 100 to 250° C./sec (500° C./sec or less), and the holding period (the thermal process time t) for which the temperature is held at the thermal process temperature (the target temperature being 1000 to 1200° C. in practice) is set to 0 sec (50 msec to 1 sec in practice). FIG. 13A shows an example of a temperature sequence in spike RTA. In spike RTA, the target temperature is set to be high to thereby improve the impurity activation rate and to thus reduce the resistance value, while the thermal process time is set to a very short period of time of 1 sec or less to thereby suppress the impurity diffusion.

With recent very small devices, however, it is difficult, even with spike RTA, to improve the activation rate while suppressing the impurity diffusion. Specifically, while a thermal process at a higher temperature is required for improving the activation rate, it is not possible to sufficiently suppress the impurity diffusion with the thermal process time being on the order of 10 to 100 msec in spike RTA.

Therefore, millisecond annealing has recently been drawing attention instead of spike RTA. FIG. 13B shows an example of a temperature sequence in millisecond annealing. As shown in FIG. 13B, in millisecond annealing, the thermal process time t is substantially shortened from 1 μsec to 100 msec as compared with spike RTA (the thermal process time t: 50 msec to 1 sec) to thereby suppress the impurity diffusion, and a very high temperature-increasing/decreasing rate Δt of about $1 \times 10^{6}$° C./sec (note that Δt is $1 \times 10^{7}$° C./sec or less) is used to thereby allow for a very short process at a high temperature (1000 to 1400° C. in practice). With such a millisecond annealing, it is possible to realize a short thermal process at a higher temperature, thereby reducing the impurity diffusion length while improving the activation rate. Generally, three methods of millisecond annealing have been proposed in the art. The first is a method in which the entire surface of a silicon wafer is heated simultaneously and directly by short-wavelength light near visible light using a flash lamp or an arc lamp as the light source (heat source). The second is a method in which a wafer is heated over a limited zone at a time by a short-wavelength pulsed laser such as an excimer laser, and the heated zone is shifted over time in a step and repeat manner to thereby eventually heat the entire wafer surface. The third is a method in which a wafer and a laser beam in the near infrared to infrared range are moved with respect to each other so as to scan and heat the entire wafer surface. While these millisecond annealing methods may each be used alone as an impurity-activating thermal process method, it is sometimes difficult to form an intended diffusion profile with the impurity diffusion being overly suppressed by millisecond annealing as described above. In view of this, also proposed in the art is a method in which a spike RTA or regular RTA process is performed successively before or after millisecond annealing (see Patent Document 1).

Patent Document 1: Japanese Patent No. 3699946

SUMMARY OF THE INVENTION

Even with such millisecond annealing, it is necessary to further increase the thermal process temperature in order to further improve the activation rate. With millisecond annealing, however, the thermal process temperature is already high (normally about 1250 to 1350° C.), as compared with spike RTA and regular RTA, because of the short process time. This is because millisecond annealing performed at a similar temperature to that of spike RTA, e.g., about 1100° C., will not be effective with the short thermal process time. In view of this, millisecond annealing is sometimes performed at a thermal process temperature of a sub-melt region close to the silicon melting temperature (1412° C.) such as about 1300 to 1350° C. Thus, with millisecond annealing being already performed at such a high temperature, it is impossible in principle to further increase the temperature, thereby restricting further improvements in the activation rate.

With such a high temperature, not a few materials are damaged by the heat even in millisecond annealing with a short thermal process time. For example, while SiGe (silicon germanium), which is widely used as a strained material, has a high germanium (Ge) content, Ge is known to have a much lower thermal resistance than silicon. This is because the melting point of Ge is 938° C. whereas that of silicon is 1412° C. Therefore, for an SiGe-containing device, the thermal process temperature cannot be set to a very high temperature even with millisecond annealing, and it is thus difficult to realize a high activation rate. While a transistor employs a polycrystalline silicon gate in various devices, the polycrystalline silicon is doped with an impurity to give conductivity, whereby the impurity-doped polycrystalline is likely to be melt and damaged when being exposed to a millisecond annealing thermal process at about 1350° C. This is because an impurity-doped polycrystalline silicon has a high degree of free carrier absorption due to the impurity, and therefore is more likely to be locally hot as compared with non-doped silicon. Thus, even though it is necessary to improve the activation rate by increasing the thermal process temperature, millisecond annealing has a factor that inhibits such temperature increasing as described above, thereby restricting further improvements in the activation rate.

In view of the problems described above, it is an object of the present invention to provide millisecond annealing in which the activation rate is further improved without increasing the impurity diffusion length even with a material of a low thermal resistance such as SiGe.

In order to achieve the object set forth above, the present invention provides an impurity-activating thermal process method, wherein a thermal cycle is successively repeated in a plurality of iterations in an impurity-activating thermal process after a target is subjected to an impurity introduction step, wherein each thermal cycle includes: increasing a temperature from an initial temperature to a first predetermined temperature T1 (° C.) at an arbitrary first temperature-increasing rate R1 (° C./sec); holding the temperature at the first predetermined temperature T1 (° C.) for an arbitrary first holding period t1 (sec); increasing the temperature from the first predetermined temperature T1 (° C.) to a second predetermined temperature T2 (° C.) at a second temperature-increasing rate R2 (° C./sec) of $1.0 \times 10^7$ (° C./sec) or less; holding the temperature at the second predetermined temperature T2 (° C.) for a second holding period t2 (sec) of 50 msec or less; decreasing the temperature from the second predetermined temperature T2 (° C.) to the first predetermined temperature T1 (° C.) at a first temperature-decreasing rate R1' (° C./sec) of $1.0 \times 10^7$ (° C./sec) or less; holding the temperature at the first predetermined temperature T1 (° C.) for an arbitrary third holding period t3 (sec); and decreasing the temperature from the first predetermined temperature T1 (° C.) to a final temperature at an arbitrary second temperature-decreasing rate R2' (° C./sec). The third holding period t3 may be set to 0 sec. In other words, the temperature may be decreased to the final temperature without holding the temperature at the first predetermined temperature T1 during the temperature-decreasing process.

In one embodiment, the impurity-activating thermal process method of the present invention includes, before performing the activation thermal process: forming an isolation region on a silicon substrate being the target; subjecting the silicon substrate to an impurity introduction for threshold control; forming a gate electrode on the silicon substrate with a gate insulating film interposed therebetween; forming an offset spacer on a sidewall of the gate electrode; implanting ions of an impurity into the silicon substrate using the gate electrode and the offset spacer as a mask to thereby form an extension region; performing a first activation thermal process for activating the impurity in the extension region; forming a sidewall spacer on the sidewall of the gate electrode with the offset spacer interposed therebetween; and implanting ions of an impurity into the silicon substrate using the gate electrode, the offset spacer and the sidewall spacer as a mask to thereby form a source/drain region.

In one embodiment of the impurity-activating thermal process method of the present invention, it is preferred that the first predetermined temperature T1 (° C.) is 400° C. to 800° C., both inclusive; and the second predetermined temperature T2 (° C.) is 1100° C. to 1400° C., both inclusive. Specifically, the first predetermined temperature T1 (° C.) is preferably a temperature at which free carrier absorption occurs in impurity-doped silicon, and that the second predetermined temperature T2 (° C.) is preferably less than or equal to the melting point of silicon.

In one embodiment of the impurity-activating thermal process method of the present invention: in a first iteration of the thermal cycle, the temperature-decreasing process ends at the first predetermined temperature T1 (° C.); in a second or subsequent iteration, excluding a final iteration, of the thermal cycle, the temperature-increasing process starts at the first predetermined temperature T1 (° C.) and the temperature-decreasing process ends at the first predetermined temperature T1 (° C.); and in the final iteration of the thermal cycle, the temperature-increasing process starts at the first predetermined temperature T1 (° C.) and the temperature-decreasing process ends at the final temperature.

In one embodiment of the impurity-activating thermal process method of the present invention, the number of iterations of the thermal cycle is 2 to 5.

In one embodiment of the impurity-activating thermal process method of the present invention, at least either before or after the activation thermal process, another thermal process is performed by holding the temperature at a third predetermined temperature T3 (° C.) lower than the second predetermined temperature T2 (° C.) for a third holding period t3 (sec) longer than the second holding period t2 (sec). In one embodiment, the other thermal process is performed both before and after the activation thermal process; and the third predetermined temperature T3 (° C.) and the third holding period t3 (sec) in the other thermal process performed before the activation thermal process are different from those in the other thermal process performed after the activation thermal process. In one embodiment, a temperature-increasing rate up to the third predetermined temperature T3 (° C.) in the other thermal process and a temperature-decreasing rate from the third predetermined temperature T3 (° C.) in the other thermal process are 500° C./sec or less; and the third holding period t3 (sec) is 50 msec to 1 sec, both inclusive. In one embodiment, the second predetermined temperature T2 (° C.) is 1100° C. to 1400° C., both inclusive; and the third predetermined temperature T3 (° C.) is 650° C. to 1150° C., both inclusive. Specifically, it is preferred that the second predetermined temperature T2 (° C.) is less than or equal to the melting point of silicon.

In one embodiment of the impurity-activating thermal process method of the present invention, a flash lamp, an arc lamp or a simultaneous irradiation-type pulsed laser is used as a heat source in the activation thermal process; and after the temperature is increased to the first predetermined temperature T1 (° C.) in the temperature-increasing process in the first iteration of the thermal cycle, a thermal process at the second predetermined temperature T2 (° C.) is successively repeated in a plurality of iterations using the flash lamp, the arc lamp or the simultaneous irradiation-type pulsed laser.

In one embodiment of the impurity-activating thermal process method of the present invention, a beam scan-type laser is used as a heat source in the activation thermal process; and instead of performing the thermal cycle in a plurality of iterations by scanning the target with a beam of the laser, an overlap of the beam of the laser is increased to thereby increase the number of times a same location of the target is irradiated with the laser beam. This brings forth substantially the same effect as that obtained when a thermal process is performed in a plurality of iterations.

In one embodiment of the impurity-activating thermal process method of the present invention, at least one of the initial temperature and the final temperature is room temperature or a vicinity thereof.

A first thermal process apparatus of the present invention is a thermal process apparatus for carrying out the impurity-activating thermal process method of claim 10 wherein the flash lamp is used, wherein: the apparatus comprises N independent charging circuits each including one of N condensers connected in parallel to one another, wherein N is the number of iterations of the thermal cycle (N is a natural number of 2 or more); and the N condensers are charged and then the N charged condensers are successively connected to the flash lamp for successively performing the thermal cycles.

A second thermal process apparatus of the present invention includes: a lamp for heating a target; and a plurality of independent charging circuits each including one of a plurality of condensers connected in parallel to one another, wherein the plurality of condensers are charged, and then the plurality of charged condensers are successively connected to the lamp.

According to the present invention, it is possible to maintain a high impurity activation rate without increasing the impurity diffusion length even when performing millisecond annealing on a material such as SiGe whose thermal resistance is lower than that of silicon. With a silicon material, it is possible to realize without crystal defects an impurity activation rate equal to or greater than that when a thermal process is performed at a high temperature close to the melting point of silicon, without increasing the thermal process temperature to be close to the melting point of silicon.

In other words, according to the present invention, it is possible to improve the impurity activation rate without thermally damaging the silicon substrate or the pattern formed thereon and without increasing the impurity diffusion length. Therefore, it is possible to reduce the resistance of the source/drain region and that of the extension region in the transistor structure, without increasing the diffusion length or the diffusion depth, whereby it is possible to improve the transistor performance while suppressing the short channel.

Moreover, according to the present invention, it is possible to suppress the damage to a device due to thermal stress or thermal fusion even with a device including a material such as SiGe whose thermal resistance is lower than that of silicon, and it is possible to improve the impurity activation rate without increasing the impurity diffusion length, whereby it is possible to improve the transistor performance.

As described above, the present invention provides an impurity-activating thermal process after impurity introduction wherein the activation rate can be further improved without increasing the impurity diffusion length, even with a material having a low thermal resistance such as SiGe.

DETAILED DESCRIPTION OF THE INVENTION

First Embodiment

An impurity-activating thermal process method according to a first embodiment of the present invention will now be described with reference to the drawings.

Figure 1A:
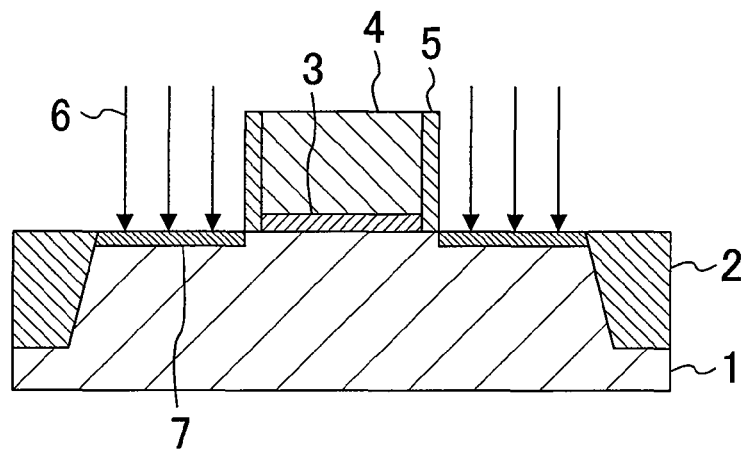
FIGS. 1A to 1C are cross-sectional views each showing a step of a method for manufacturing a semiconductor device using an impurity-activating thermal process method according to first and second embodiments of the present invention.
Figure 1B:
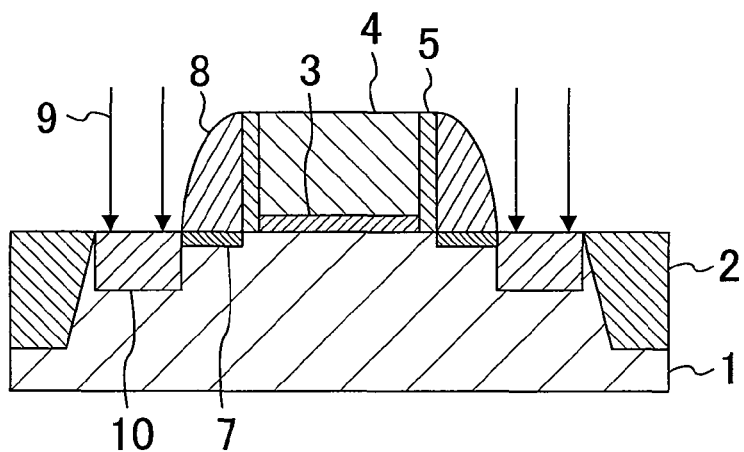
Figure 1C:
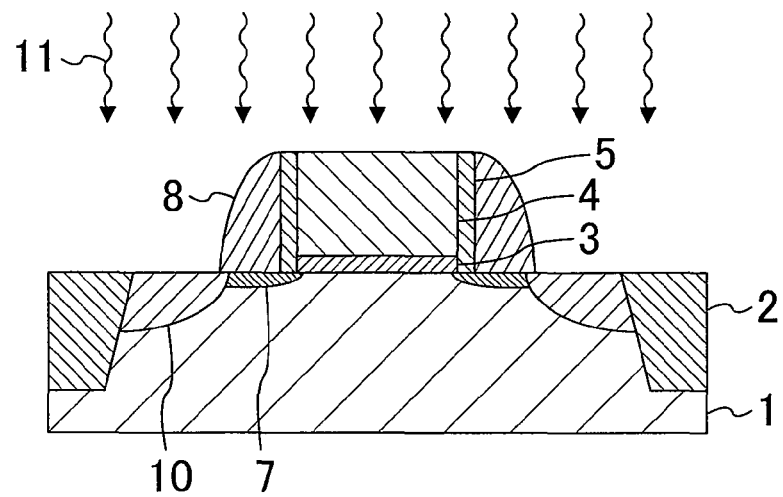

FIGS. 1A to 1C are cross-sectional views each showing a step of a method for manufacturing a semiconductor device based on an impurity-activating thermal process method of the present embodiment, more specifically a method for forming a MOS (metal-oxide-semiconductor) transistor using millisecond annealing for impurity activation.

First, as shown in FIG. 1A, an isolation region 2 is formed on a silicon substrate 1, and an impurity is introduced into the silicon substrate 1 for threshold control, after which a gate electrode 4 is formed on the silicon substrate 1 with a gate insulating film 3 interposed therebetween. Then, after an offset spacer 5 is formed on the sidewall of the gate electrode 4, the silicon substrate 1 is subjected to an impurity ion implantation 6 using the gate electrode 4 and the offset spacer 5 as a mask to thereby form an extension region 7. With the offset spacer 5, the distance from the extension region 7 to an edge of the gate electrode 4 is adjusted. Then, a first iteration of the activation thermal process for activating the impurity in the extension region 7 is performed.

Then, as shown in FIG. 1B, after a sidewall spacer 8 is formed on the sidewall of the gate electrode 4 with the offset spacer 5 interposed therebetween, the silicon substrate 1 is subjected to an impurity ion implantation 9 using the gate electrode 4, the offset spacer 5 and the sidewall spacer 8 as a mask to thereby form a source/drain region 10.

Figure 2:
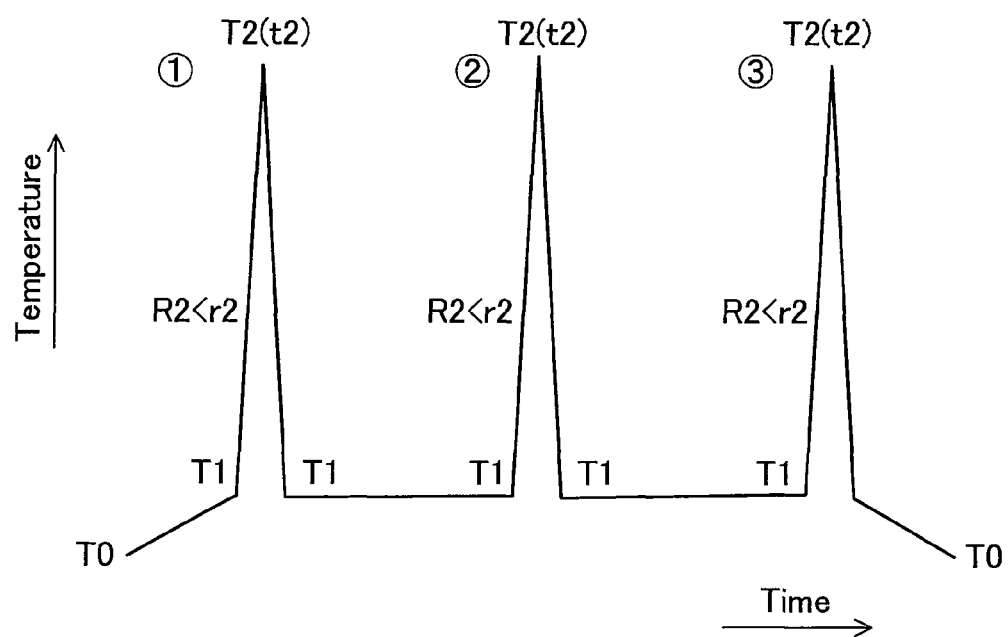
FIG. 2 shows an example of a temperature sequence in the impurity-activating thermal process method according to the first embodiment of the present invention.

Then, as shown in FIG. 1C, the silicon substrate 1 on which a MOS transistor has been formed is subjected to a thermal process 11, i.e., the impurity-activating thermal process method of the present embodiment. The impurity-activating thermal process method of the present embodiment will now be described in detail. FIG. 2 shows an example of a temperature sequence in the impurity-activating thermal process method of the present embodiment.

First, the temperature of the silicon substrate 1 (hereinafter referred to as a "silicon wafer") on which a MOS transistor has been formed is increased from a room temperature (the term "room temperature" as used herein includes temperatures around room temperature) T0 (° C.) being the initial temperature to a first predetermined temperature T1 (° C.) at an arbitrary first temperature-increasing rate R1 (° C./sec). Herein, the first predetermined temperature T1 (° C.) is such that free carriers are generated in a silicon wafer and the free carriers efficiently absorb lamp light or laser light, whereby the temperature of the silicon wafer can easily be increased, and such that there is no increase in the diffusion length of the impurity already introduced into the silicon wafer and there is no inactivation of the introduced impurity. Specifically, the first predetermined temperature T1 (° C.) is selected from a temperature range of 400 to 800° C. In the present embodiment, the first predetermined temperature T1 (° C.) was set to 400° C., and the holding period (the first holding period t1 (sec)) for holding the temperature at T1 was set to 30 sec, for example. The temperature increase to the first predetermined temperature T1 (° C.) also serves to mitigate the thermal stress to be imparted when thereafter increasing the temperature from the first predetermined temperature T1 (° C.) to a very high temperature within a short period of time. While the first holding period t1 (sec) may be any period of time as long as free carriers are stably generated and it varies depending on the heating method, it can be set to a period of time from about 1 sec to about 1 min. Specifically, where a light radiation from a lamp, or the like, is used for the heating to the first predetermined temperature T1 (° C.), the first holding period t1 (sec) may be about 1 sec. Where the heating is done by placing a silicon wafer on a stage of a resistance heater (so called a "hot plate"), the first holding period t1 (sec) should be about 30 sec to about 60 sec for the temperature stability. In either case, the first holding period t1 (sec) being 1 sec or more is sufficient as long as the silicon wafer is accurately at the first predetermined temperature T1 (° C.). The higher the first predetermined temperature T1 (° C.) is, the more the diffusion length increase is influenced by the first holding period t1 (sec). Therefore, it is preferred that the first predetermined temperature T1 (° C.) is set to be a few sec or less. If a resistance heater is used as the heat source for setting the first predetermined temperature T1 (° C.) to a high temperature of about 800° C., it will take about 30 to 60 sec to heat the silicon wafer to a predetermined temperature, and the silicon wafer will receive an excessive thermal process. If a resistance heater is used as the heat source for setting the first predetermined temperature T1 (° C.) to a low temperature of about 400° C., there will be no problem even if it takes a long time to heat the silicon wafer to a predetermined temperature.

Then, after the temperature of the silicon wafer is increased from the first predetermined temperature T1 (° C.) of 400° C. to the second predetermined temperature T2 (° C.) of 1310° C. at the second temperature-increasing rate R2 (° C./sec) less than or equal to the maximum rate r2 (e.g., $1.0 \times 10^6$ (° C./sec)), the temperature is held at the second predetermined temperature T2 (° C.) of 1310° C. for the second holding period t2 (sec) of 1 msec. Then, the temperature of the silicon wafer is decreased from the second predetermined temperature T2 (° C.) of 1310° C. to the first predetermined temperature T1 (° C.) of 400° C. at the first temperature-decreasing rate R1' (° C./sec) less than or equal to the maximum rate r1' (e.g., $1.0 \times 10^6$ (° C./sec)).

Then, in the impurity-activating thermal process method of the present embodiment, the second thermal cycle is performed, as is the first thermal cycle, without cooling the silicon wafer to room temperature. Specifically, first, the temperature of the silicon wafer is increased from the first predetermined temperature T1 (° C.) of 400° C. to the second predetermined temperature T2 (° C.) of 1310° C. at the second temperature-increasing rate R2 (° C./sec) less than or equal to the maximum rate r2 (e.g., $1.0 \times 10^6$ (° C./sec)), after which the temperature is held at the second predetermined temperature T2 (° C.) of 1310° C. for the second holding period t2 (sec) of 1 msec. Then, the temperature of the silicon wafer is decreased from the second predetermined temperature T2 (° C.) of 1310° C. to the first predetermined temperature T1 (° C.) of 400° C. at the first temperature-decreasing rate R1' (° C./sec) less than or equal to the maximum rate r1' (e.g., $1.0 \times 10^6$ (° C./sec)).

Then, in the impurity-activating thermal process method of the present embodiment, the third thermal cycle (the final thermal cycle in the present embodiment) is performed, as is the second thermal cycle, without cooling the silicon wafer to room temperature. Note that in the third thermal cycle, the temperature of the silicon wafer is decreased from the second predetermined temperature T2 (° C.) of 1310° C. to the first predetermined temperature T1 (° C.) of 400° C., and is then decreased from the first predetermined temperature T1 (° C.) of 400° C. to the room temperature T0 being the final temperature at the arbitrary second temperature-decreasing rate R2' (° C./sec).

Since the infrared absorption effect of the free carriers is not needed during the temperature-decreasing process in each thermal cycle, the holding period (the third holding period t3 (sec)) at the first predetermined temperature T1 (° C.) is basically not necessary. Therefore, the third holding period t3 (sec) may be 1 sec or less. Where flash lamp irradiation to be described later is performed in the repetition of the thermal cycle (successive millisecond annealing), it is necessary to once stable the temperature at the first predetermined temperature T1 (° C.) before the temperature-increasing process, and it is necessary to provide a period of time for charging the condenser of the lamp annealing apparatus. Therefore, a period of time of about 1 to 10 sec is needed for the third holding period t3 (sec).

In the present embodiment, a carbon dioxide gas laser having a wavelength of 10.6 μm was used as the light source of millisecond annealing, for example. The laser beam has a 5.5 mm long side and a 110 μm short side, and has an energy intensity of the Gaussian distribution. For the irradiation of the silicon wafer with a laser beam, an X-Y scanning operation (accurately, X scanning and Y stepping) was performed with a beam overlap of 2 mm and a scanning speed of 110 mm/sec. Herein, the X scanning direction is along the short side of the laser beam, and the Y stepping direction is along the long side of the laser beam. Thus, there is a beam overlap if the Y stepping width is less than the length of the long side of the laser beam. With the length of the long side of the laser beam being 5.5 mm in the present embodiment, there is a beam overlap of 2 mm if the Y stepping width is 3.5 mm. With such settings, the thermal process time required for a single thermal cycle is equal to (the beam short side length (110 μm)/the beam scanning speed (110 mm/sec))=1 msec. In the present embodiment, the first thermal cycle was performed by scanning the entire surface of the wafer with the above scanning conditions, and then scanning operations were performed for the second and third thermal cycles, as in the first thermal cycle. If the scanning direction on the wafer in each thermal cycle is changed by (360°/N) (N is the number of iterations of the thermal process) from that of the preceding thermal cycle, it is possible to reduce the problem of beam stitching due to scanning the same location on the wafer. In the present embodiment, however, the scanning direction on the wafer was set to be perpendicular to the notch direction in each of the first to third thermal cycles.

While the maximum rate r2 of the second temperature-increasing rate R2 and the maximum rate r1' of the first temperature-decreasing rate R1' were both set to 1.0×10$^6$ (° C./sec) in the present embodiment, the present invention is not limited thereto, but the maximum rate r2 and the maximum rate r1' may each be set to an arbitrary value being 1.0×10$^7$ (° C./sec) or less.

While the number of iterations of the thermal cycle was set to 3 in the present embodiment, the present invention is not limited thereto, but the number may be set to an arbitrary number from 2 to 5.

While the second predetermined temperature T2 was set to 1310° C. in the present embodiment, the present invention is not limited thereto, but the second predetermined temperature T2 may be set to an arbitrary temperature from 1100° C. to 1400° C. (i.e., less than or equal to the melting point of silicon).

While the thermal process temperature (i.e., the second predetermined temperature T2) was set to the same temperature in each of the first to third thermal cycles in the present embodiment, some or all of the thermal cycles may use different thermal process temperatures.

While the first predetermined temperature T1 was set to the same temperature in each of the first to third thermal cycles in the present embodiment, some or all of the thermal cycles may use different first predetermined temperatures T1. Nevertheless, since the thermal process at the first predetermined temperature T1 is a process for generating free carriers, it is preferred that the first predetermined temperature T1 is set to be around 400° C., being the lowest temperature at which free carriers are generated, so as not to increase the diffusion length. If the first predetermined temperature T1 is varied for each thermal cycle, the amount of free carriers generated will also substantially vary for each thermal cycle. Since the free carrier concentration exponentially influences the infrared absorption, the temperature control during a high-temperature process will be difficult if the first predetermined temperature T1 is varied for each thermal cycle. Therefore, it is preferred that the first to third thermal cycles all use the same first predetermined temperature T1.

While a beam scan-type laser (carbon dioxide gas laser) was used as the light source (heat source) of millisecond annealing in the present embodiment, a flash lamp, an arc lamp or a simultaneous irradiation-type pulsed laser may be used. In such a case, after the temperature is increased to the first predetermined temperature T1 (° C.) in the temperature-increasing process in the first iteration of the thermal cycle, a thermal process at the second predetermined temperature T2 (° C.) may be successively repeated in a plurality of iterations using a flash lamp, an arc lamp or a simultaneous irradiation-type pulsed laser, as in the present embodiment.

In the present embodiment, the beam overlap in the beam scan operation of the beam scan-type laser is set to 36%, for example. In such a case, while there is a portion of the silicon wafer that is scanned twice and a portion that is scanned three times, this is primarily dependent on the beam shape, and the beam overlap is determined so that substantially an even energy is given across the entire surface of the wafer, irrespective of the number of scans.

In the present embodiment, the second and subsequent thermal cycles were performed starting from the first predetermined temperature T1, in order to shorten the process time. Alternatively, after every thermal cycle, the wafer may be taken out of the thermal process apparatus after the temperature thereof is decreased from the first predetermined temperature T1 to the room temperature T0 being the final temperature, after which the following thermal cycle may be performed successively starting from the room temperature T0 being the initial temperature.

While a plurality of thermal cycles were performed using a beam scan-type laser in the present embodiment, it is possible to obtain substantially the same effect as that obtained from three thermal cycles by setting the laser beam overlap to about 90%, for example. That is, by adjusting the beam overlap, it is possible to increase the number of times the same location of the silicon wafer is scanned with the beam, thereby obtaining a similar effect to that obtained by increasing the number of iterations of the thermal cycle. In a case where the beam overlap is adjusted, it is necessary to fully examine the appropriateness of the shape of the beam along the long side (the length of the long side, i.e., the energy distribution in the long side direction) and the number of overlaps (the number of scans determined by the Y stepping width in the Y direction). There is no significant difference in the process time between the method in which the beam overlap is increased and the method in which the thermal cycle is performed in a plurality of iterations starting from the first predetermined temperature T1, for example.

Figure 3A:
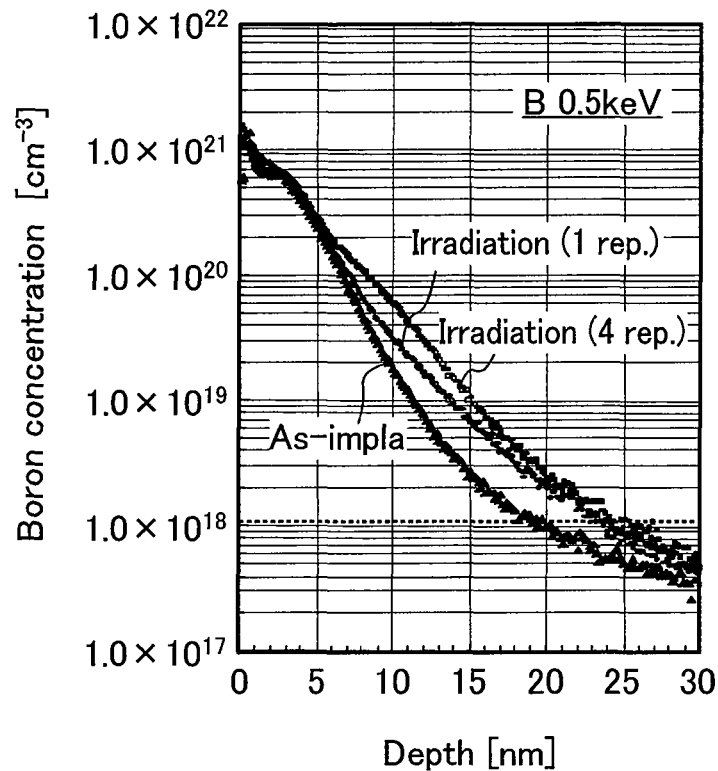
FIG. 3A shows the variation of the impurity diffusion length with respect to the number of iterations of the thermal cycle in the impurity-activating thermal process method according to the first embodiment of the present invention.

FIG. 3A shows the variation of the impurity diffusion length with respect to the number of iterations of the thermal cycle in millisecond annealing of the present embodiment. The silicon wafer is subjected to ion implantation at 0.5 keV using boron (B), which has a high diffusion coefficient, as the impurity introduced. FIG. 3A shows an impurity profile where only ion implantation is performed ("As-implant"), an impurity profile where a single iteration of the thermal cycle is performed at a thermal process temperature (i.e., the second predetermined temperature T2) of 1350° C., and an impurity profile where four iterations of the thermal cycle are performed at a thermal process temperature of 1350° C., all measured by SIMS (secondary ion mass spectrometry). As shown in FIG. 3A, in a case where a single iteration of the thermal cycle is performed at a thermal process temperature of 1350° C., as compared with "As-implant", the impurity diffusion length at a B concentration of $1 \times 10^{18}/cm^3$ is increased by about 5 nm from 18 nm to 23 nm, but the impurity diffusion length is sufficiently suppressed. In a case where four iterations of the thermal cycle are performed at a thermal process temperature of 1350° C., the impurity diffusion length is about the same as that when a single iteration of the thermal cycle is performed at a thermal process temperature of 1350° C., and there is observed no increase in the impurity diffusion length caused by an increase in the number of iterations of the thermal cycle. As to the impurity profile, the process with four iterations of the thermal cycle, as compared with that with a single iteration of the thermal cycle, has a higher boron concentration for the medium diffusion depth, resulting in a more abrupt junction shape.

Figure 3B:
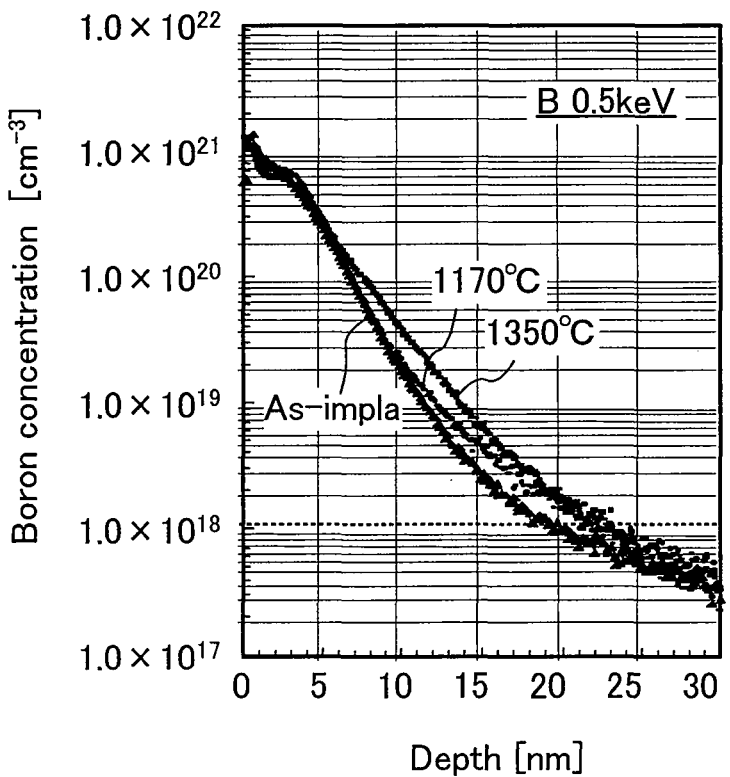
FIG. 3B shows the variation of the impurity diffusion length with respect to the thermal process temperature of the thermal cycle in the impurity-activating thermal process method according to the first embodiment of the present invention.

FIG. 3B shows the variation of the impurity diffusion length with respect to the thermal process temperature of the thermal cycle in millisecond annealing of the present embodiment. As with FIG. 3A, the silicon wafer is subjected to ion implantation at 0.5 keV using boron (B), which has a high diffusion coefficient, as the impurity introduced. FIG. 3B shows an impurity profile where only ion implantation is performed ("As-implant"), an impurity profile where the thermal process temperature of the thermal cycle (i.e., the second predetermined temperature T2) is 1170° C., and an impurity profile where the thermal process temperature of the thermal cycle is 1350° C., all measured by SIMS. As shown in FIG. 3B, both in a case where the thermal process temperature of the thermal cycle is 1170° C. and in a case where it is 1350° C., as compared with "As-implant", the impurity diffusion length at a B concentration of $1 \times 10^{8}/cm^3$ is increased by about 5 nm, but the impurity diffusion length is sufficiently suppressed. There is observed no increase in the impurity diffusion length caused by an increase in the thermal process temperature of the thermal cycle.

These results shown in FIGS. 3A and 3B indicate that the impurity diffusion length is not increased by millisecond annealing of performing a plurality of thermal cycles as in the present embodiment, and that the impurity diffusion length is not varied by a change in the thermal process temperature in each thermal cycle. Thus, the impurity diffusion length is not increased by millisecond annealing of successively performing a plurality of thermal cycles as in the present embodiment.

Figure 4A:
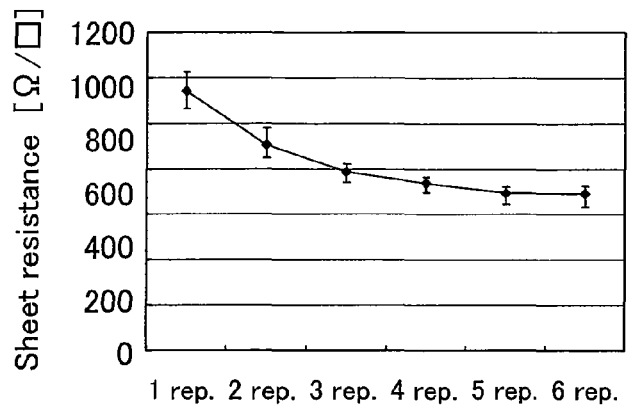
FIG. 4A shows the variation of the sheet resistance with respect to the number of iterations of the thermal cycle in the impurity-activating thermal process method according to the first embodiment of the present invention.

FIG. 4A shows the variation of the sheet resistance with respect to the number of iterations of the thermal cycle in millisecond annealing of the present embodiment. As with FIG. 3A, the silicon wafer is subjected to ion implantation at 0.5 keV using boron (B), which has a high diffusion coefficient, as the impurity introduced. FIG. 4A shows the sheet resistances for 1 to 6 iterations of the thermal cycle performed at a thermal process temperature (i.e., the second predetermined temperature T2) of 1310° C. As shown in FIG. 4A, while the sheet resistance is 1200Ω/□ when the number of iterations of the thermal cycle is 1, the sheet resistance decreases as the number of iterations of the thermal cycle increases, wherein the sheet resistance is decreased by about 30% to 800Ω/□ when the number of iterations of the thermal cycle is 3, and the sheet resistance is decreased by about 40% to 700Ω/□ when the number of iterations of the thermal cycle is 5. However, the decrease in the sheet resistance is saturated when the number of iterations of the thermal cycle is 6. Therefore, in the present embodiment, the upper limit for the number of iterations of the thermal cycle is set to 5. While there will be no significant problems when the number of iterations of the thermal cycle is set to 6 or more, it is not expected to provide a decrease in the sheet resistance, i.e., an improvement in the activation rate.

Figure 4B:
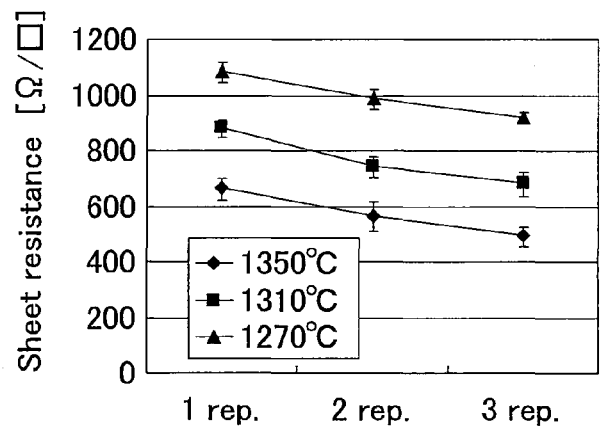
FIG. 4B shows the variation of the sheet resistance with respect to the thermal process temperature of the thermal cycle and the number of iterations thereof in the impurity-activating thermal process method according to the first embodiment of the present invention.

FIG. 4B shows the variation of the sheet resistance in millisecond annealing of the present embodiment with respect to the number of iterations of the thermal cycle being varied from 1 to 3 for each of the thermal process temperatures (i.e., the second predetermined temperature T2) of 1270° C., 1310° C. and 1350° C. As shown in FIG. 4B, the sheet resistance decreases and the activation rate improves as the number of iterations of the thermal cycle increases, but the sheet resistance value is of course significantly influenced also by the thermal process temperature. Specifically, in order to obtain, with a thermal process temperature of 1310° C., substantially the same sheet resistance as that obtained when performing a single iteration of the thermal cycle at a thermal process temperature of 1350° C., it is necessary to set the number of iterations of the thermal cycle at a thermal process temperature of 1310° C. to about 5. In order to obtain, with a thermal process temperature of 1270° C., substantially the same sheet resistance as that obtained when performing a single iteration of the thermal cycle at a thermal process temperature of 1350° C., it is necessary to set the number of iterations of the thermal cycle at a thermal process temperature of 1270° C. to about 8. In view of productivity, however, the number of iterations of the thermal cycle should be limited to 5, and if the activation rate is insufficient with the number of iterations of the thermal cycle being 5, it is necessary to increase the thermal process temperature so that a sufficient activation rate is obtained by the number of iterations being 5 or so. If the thermal process temperature of the thermal cycle cannot be increased due to material limitations, it is necessary to increase the number of iterations of the thermal cycle even at the risk of sacrificing productivity.

As described above, with the thermal cycle being repeated in a plurality of iterations as in the present embodiment, it is possible to maintain a high impurity activation rate without increasing the impurity diffusion length even when performing millisecond annealing on a material such as SiGe whose thermal resistance is lower than that of silicon. With a silicon material, it is possible to realize without crystal defects an impurity activation rate equal to or greater than that when a thermal process is performed at a high temperature close to the melting point of silicon, without increasing the thermal process temperature to be close to the melting point of silicon.

In other words, according to the present embodiment, it is possible to improve the impurity activation rate without thermally damaging the silicon substrate or the pattern formed thereon and without increasing the impurity diffusion length. Therefore, it is possible to reduce the resistance of the source/drain region and that of the extension region in the transistor structure, without increasing the diffusion length or the diffusion depth, whereby it is possible to improve the transistor performance while suppressing the short channel.

Moreover, according to the present embodiment, it is possible to suppress the damage to a device due to thermal stress or thermal fusion even with a device including a material such as SiGe whose thermal resistance is lower than that of silicon, and it is possible to improve the impurity activation rate without increasing the impurity diffusion length, whereby it is possible to improve the transistor performance.

Second Embodiment

Figure 5:
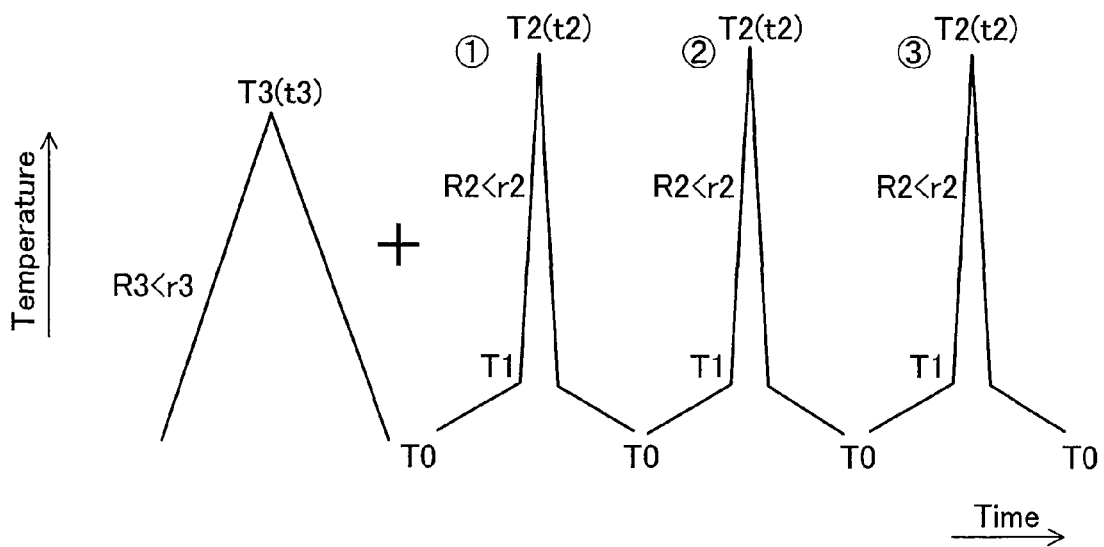
FIG. 5 shows an example of a temperature sequence in the impurity-activating thermal process method according to the second embodiment of the present invention.

An impurity-activating thermal process method according to a second embodiment of the present invention will now be described with reference to the drawings. The method of manufacturing a semiconductor device using the impurity-activating thermal process method of the present embodiment, more specifically steps of a method for forming a MOS transistor using millisecond annealing for impurity activation, are the same as those of the first embodiment shown in FIGS. 1A to 1C. Specifically, an impurity is introduced into the silicon substrate 1 to form the extension region 7 and the source/drain region 10, and then the impurity-activating thermal process method of the present embodiment is performed. The impurity-activating thermal process method of the present embodiment will now be described in detail. FIG. 5 shows an example of a temperature sequence in the impurity-activating thermal process method of the present embodiment.

First, the silicon substrate 1 (hereinafter referred to as a "silicon wafer") on which a MOS transistor has been formed is subjected to spike RTA in a nitrogen atmosphere at a thermal process temperature (the third predetermined temperature T3) of 1050° C., for example, for the impurity activation and for adjusting the impurity diffusion length. Specifically, after the temperature is increased from the room temperature (the term "room temperature" as used herein includes temperatures around room temperature) T0 (° C.) being the initial temperature to the third predetermined temperature T3 of 1050° C. at a third temperature-increasing rate R3 (° C./sec) less than or equal to the maximum rate r3 (e.g., 250 (° C./sec)), the temperature is held for the third holding period t3 (sec) of 0 sec (100 msec to 1 sec in practice) at the third predetermined temperature T3 of 1050° C. Then, the temperature is decreased from the third predetermined temperature T3 of 1050° C. to the room temperature T0 being the final temperature at a third temperature-decreasing rate R3' (° C./sec) less than or equal to the maximum rate r3' (e.g., 140 (° C./sec)). With such condition settings, it is possible to activate the impurity to some extent, and to control the diffusion length of boron, which is the impurity introduced, to about 30 nm.

However, since the activation rate is insufficient only with spike RTA, millisecond annealing including a plurality of thermal cycles as in the first embodiment is successively performed in the present embodiment. The number of iterations of the thermal cycle was set to 2 or 3. The first predetermined temperature T1 (° C.) was set to 400° C. in each thermal cycle, and the second predetermined temperature T2 (° C.) was set to 1310° C. in the first thermal cycle, and to 1310° C. or a different temperature (e.g., 1330° C.) in the second and subsequent thermal cycles. The maximum rate r2 of the second temperature-increasing rate R2 (° C./sec) was set to $1.0 \times 10^6$ (° C./sec) in each thermal cycle, and the second holding period t2 (sec) at the second predetermined temperature T2 was set to 1 msec in each thermal cycle. In the present embodiment, an independent thermal cycle was performed in a plurality of successive iterations by taking out the silicon wafer from the thermal process apparatus after every thermal cycle. Specifically, in each thermal cycle, the temperature-increasing process is performed starting from the room temperature T0 being the initial temperature, and the temperature-decreasing process is performed ending at the room temperature T0 being the final temperature. Moreover, in the present embodiment, a carbon dioxide gas laser having a wavelength of 10.6 μm was used as the light source of millisecond annealing, for example, as in the first embodiment.

Figure 6:
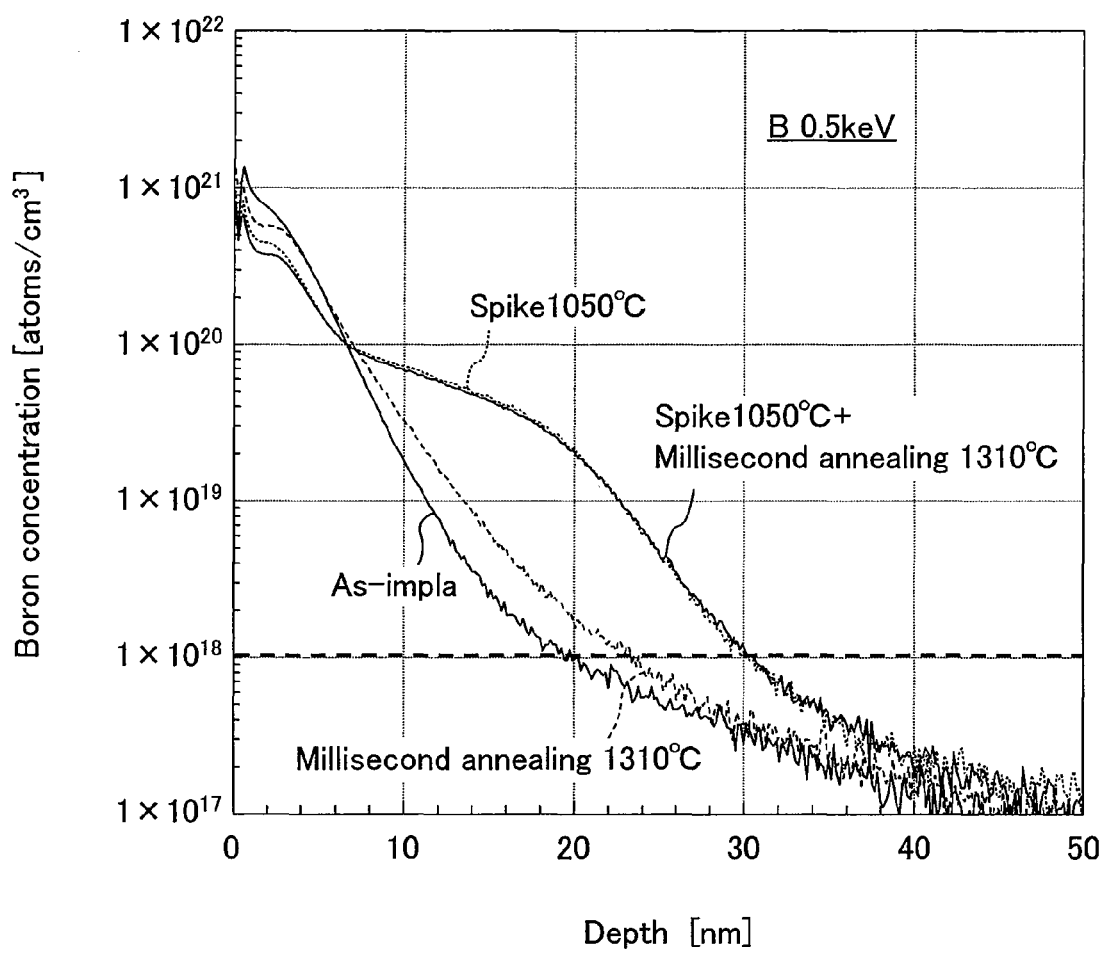
FIG. 6 shows an impurity profile measured when only ion implantation is performed, an impurity profile measured when only spike RTA is performed after the ion implantation, an impurity profile measured when only millisecond annealing including a single thermal cycle is performed after the ion implantation, and an impurity profile measured when spike RTA and millisecond annealing including a single thermal cycle are performed after the ion implantation.

FIG. 6 shows an impurity profile where only ion implantation is performed ("As-implant"), an impurity profile where only spike RTA at a thermal process temperature of 1050° C. is performed as the impurity-activating thermal process after the ion implantation, an impurity profile where only millisecond annealing including a single thermal cycle at a thermal process temperature of 1310° C. is performed as the impurity-activating thermal process after the ion implantation, and an impurity profile where spike RTA at a thermal process temperature of 1050° C. and millisecond annealing including a single thermal cycle at a thermal process temperature of 1310° C. are performed as the impurity-activating thermal process after the ion implantation, all measured by SIMS. The silicon wafer is subjected to ion implantation at 0.5 keV using boron (B), which has a high diffusion coefficient, as the impurity introduced. As shown in FIG. 6, while the impurity diffusion depth at a B concentration of $1 \times 10^8/cm^3$ for "As-implant" is 20 nm, the impurity diffusion depth at a B concentration of $1 \times 10^{18}/m^3$ where only spike RTA (1050° C.) is performed is 30 nm, the impurity diffusion depth at a B concentration of $1 \times 10^{18}/cm^3$ where only millisecond annealing including a single thermal cycle (1310° C.) is performed is 23 nm, and the impurity diffusion depth at a B concentration of $1 \times 10^{18}/cm^3$ where spike RTA (1050° C.) and millisecond annealing including a single thermal cycle (1310° C.) are performed is 30 nm. Thus, the impurity profile depends substantially solely on spike RTA, and millisecond annealing makes little difference. Thus, it is possible to control the impurity diffusion length by performing spike RTA or RTA before or after millisecond annealing. Since the activation rate by spike RTA is not sufficient even if the thermal process temperature is 1050° C., the temperature and the time of spike RTA or RTA may be determined simply for the purpose of controlling the impurity diffusion length, and the impurity activation may be done by the millisecond annealing before or after the spike RTA or RTA.

Figure 7A:
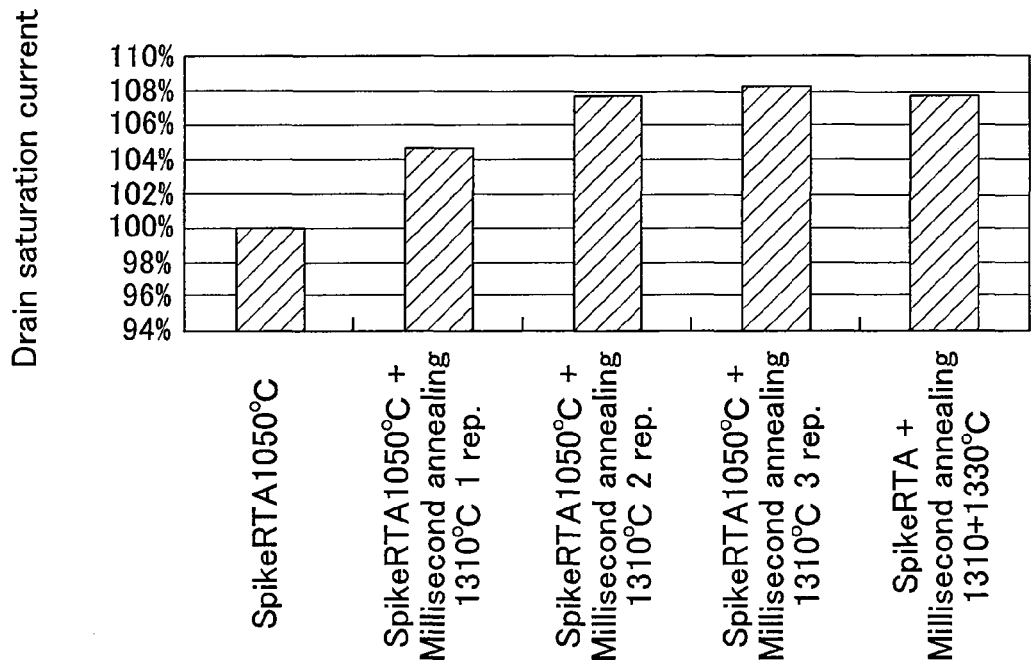
FIGS. 7A and 7B show the drain current (saturation current) of the N-channel transistor and that of the P-channel transistor, respectively, where the impurity-activating thermal process method according to the second embodiment of the present invention is used in the impurity-activating thermal process after the impurity introduction for forming the extension region and the source/drain region.
Figure 7B:
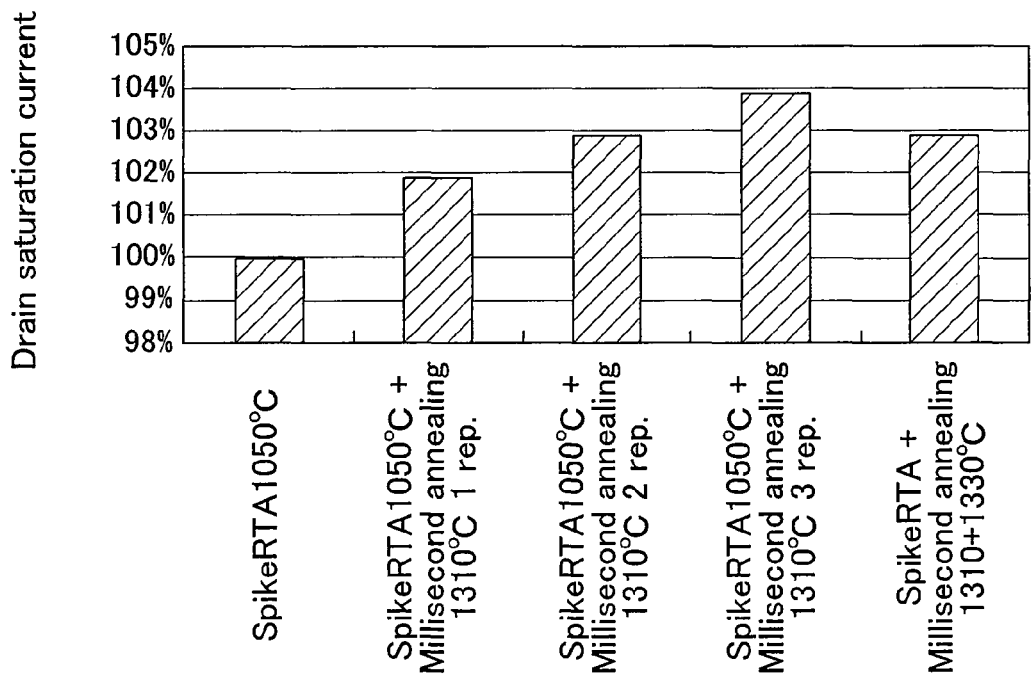

FIGS. 7A and 7B show the drain current (saturation current) of the N-channel transistor and that of the P-channel transistor, respectively, where the impurity-activating thermal process method of the present embodiment is used in the impurity-activating thermal process after the impurity introduction for forming the extension region and the source/drain region. The drain current was evaluated for a case where only spike RTA at a thermal process temperature of 1050° C. was performed, a case where spike RTA at a thermal process temperature of 1050° C. and millisecond annealing including a single thermal cycle at a thermal process temperature of 1310° C. were performed, a case where spike RTA at a thermal process temperature of 1050° C. and millisecond annealing including two thermal cycles at a thermal process temperature of 1310° C. were performed, a case where spike RTA at a thermal process temperature of 1050° C. and millisecond annealing including three thermal cycles at a thermal process temperature of 1310° C. was performed, and a case where spike RTA at a thermal process temperature of 1050° C., millisecond annealing including a single thermal cycle at a thermal process temperature of 1310° C. and millisecond annealing including a single thermal cycle at a thermal process temperature of 1330° C. were performed.

As shown in FIG. 7A, with the drain current of the N-channel transistor where only spike RTA at a thermal process temperature of 1050° C. is performed being 100%, the drain current is increased by 4.7% by the addition of millisecond annealing including a single thermal cycle at a thermal process temperature of 1310° C., by 7.7% by the addition of millisecond annealing including two thermal cycles at a thermal process temperature of 1310° C., and by 8.4% by the addition of millisecond annealing including three thermal cycles at a thermal process temperature of 1310° C. Moreover, the drain current is increased by 7.7% by the addition of millisecond annealing including a single thermal cycle at a thermal process temperature of 1310° C. and millisecond annealing including a single thermal cycle at a thermal process temperature of 1330° C.

As shown in FIG. 7B, with the drain current of the P-channel transistor where only spike RTA at a thermal process temperature of 1050° C. is performed being 100%, the drain current is increased by 1.6% by the addition of millisecond annealing including a single thermal cycle at a thermal process temperature of 1310° C., by 2.9% by the addition of millisecond annealing including two thermal cycles at a thermal process temperature of 1310° C., and by 3.9% by the addition of millisecond annealing including three thermal cycles at a thermal process temperature of 1310° C. Moreover, the drain current is increased by 3.9%, thereby accordingly improving the driving capability, by the addition of millisecond annealing including a single thermal cycle at a thermal process temperature of 1310° C. and millisecond annealing including a single thermal cycle at a thermal process temperature of 1330° C.

As described above, it can be seen that the driving capability of the transistor is improved by repeating the thermal cycle in a plurality of iterations in millisecond annealing. The drain current was increased only by 4.2% in the N-channel transistor with respect to the drain current of 100% obtained in a case where only spike RTA at a thermal process temperature of 1050° C. was performed, when the thermal process temperature of the thermal cycle was kept at 1310° C. while setting the holding period for holding the temperature at that temperature to 3 msec being three times that of the present embodiment. If the holding period for holding the temperature at 1310° C. is multiplied by three, the holding period will be equal to the total holding period for holding the temperature at 1310° C. for three thermal cycles. However, the increase (4.2%) in the drain current of the N-channel transistor obtained by simply multiplying the holding period for holding the temperature at 1310° C. by three is about the same as that the increase (4.7%) in the drain current obtained by millisecond annealing including a single thermal cycle at a thermal process temperature of 1310° C. (with a holding period of 1 msec).

Thus, it can be seen that simply multiplying the holding period by three is not equivalent, for transistor characteristics, i.e., the impurity activation, to successively repeating the thermal cycle of millisecond annealing three times. This can be considered a special characteristic of millisecond annealing. The reason is as follows. In millisecond annealing, the silicon wafer surface is irradiated with light of a certain energy density, and the light is absorbed by the silicon wafer surface, thereby rapidly increasing the temperature of the silicon wafer surface. However, since the temperature of silicon wafer is increased within a very short period of time, it is a very shallow portion up to several μm down from the silicon wafer surface that actually reaches the second predetermined temperature T2 (e.g., a thermal process temperature of 1310° C.). If the holding period for holding the temperature at 1310° C. is extended, the heat is conducted deeper into the silicon wafer, whereby the actual temperature of the silicon wafer surface will be lower than the expected value. As to heating, in a method of heating the silicon wafer by scanning the silicon wafer with a laser beam as in the present embodiment, an increase in the thermal process temperature holding period is realized by lowering the laser beam scanning speed. However, lowering the scanning speed results in also lowering the temperature-increasing rate. With a lowered temperature-increasing rate, the energy density per unit time of light used for increasing the temperature to the second predetermined temperature T2 will be smaller than that with a higher temperature-increasing rate. Therefore, the energy density at the silicon wafer surface is lowered as compared with a case where the temperature is increased rapidly at a high temperature-increasing rate, thereby substantially lowering the temperature of the silicon wafer surface.

As described above, increasing the thermal process temperature holding period in millisecond annealing results in substantially lowering the thermal process temperature, and is substantially different from repeating the thermal cycle of millisecond annealing in a plurality of iterations. In other words, the impurity activation rate obtained when performing N thermal cycles is much higher than the impurity activation rate obtained when multiplying the thermal process temperature holding period by N. If the thermal process temperature holding period is elongated or the temperature-increasing rate is lowered, heat is conducted from the silicon wafer surface toward the inside of the silicon wafer, whereby the temperature of the silicon wafer surface will not be increased, but the energy from the millisecond annealing will be consumed in increasing the temperature of a deeper portion apart from the silicon wafer surface. The impurity is present within a depth of 20 nm or less down from the silicon wafer surface in the extension region, and the impurity is present within a depth of 40 nm or less down from the silicon wafer surface in the source/drain region. Therefore, it is important, for improving the impurity activation rate, that only the silicon wafer surface is heated.

Figure 8A:
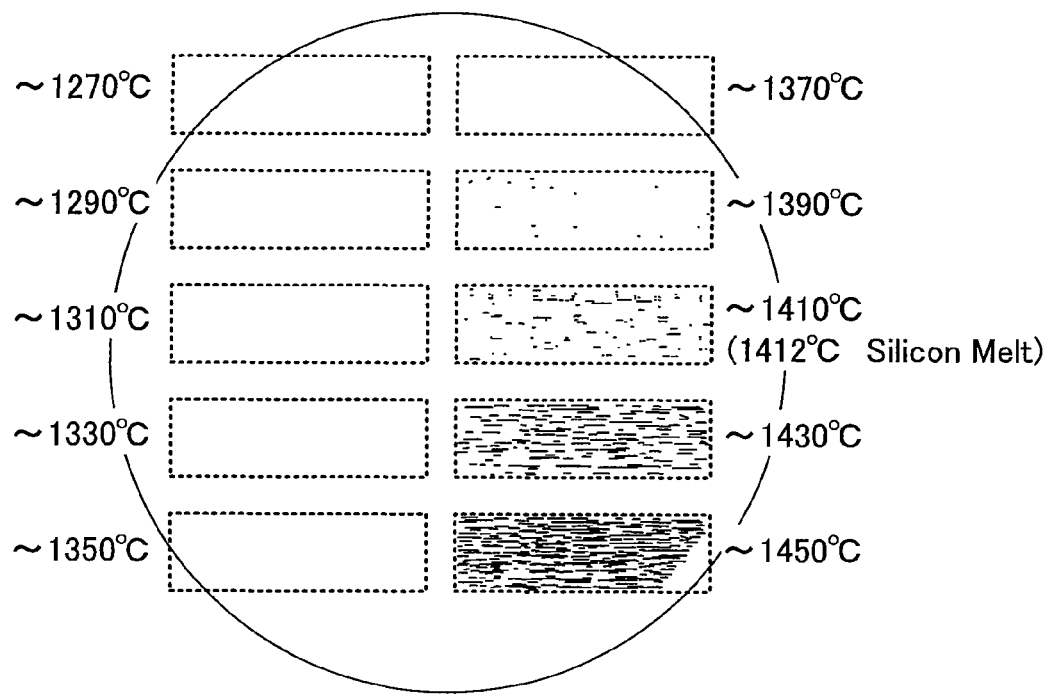
FIG. 8A shows crystal defects (black portions in the figure) occurring in a silicon substrate when the silicon substrate is subjected to millisecond annealing at various thermal process temperatures.

FIG. 8A shows crystal defects (black portions in the figure) occurring in a silicon substrate when the silicon substrate is subjected to millisecond annealing at various temperatures from 1270° C. to 1450° C. As shown in FIG. 8A, crystal defects start to occur in the silicon substrate as the thermal process temperature becomes 1370° C. or more, and there are observed significant crystal defects in the silicon substrate as the thermal process temperature becomes 1412° C. or more, 1412° C. being the melting point of silicon. On the other hand, no crystal defects are observed with a thermal process temperature below 1370° C.

Figure 8B:
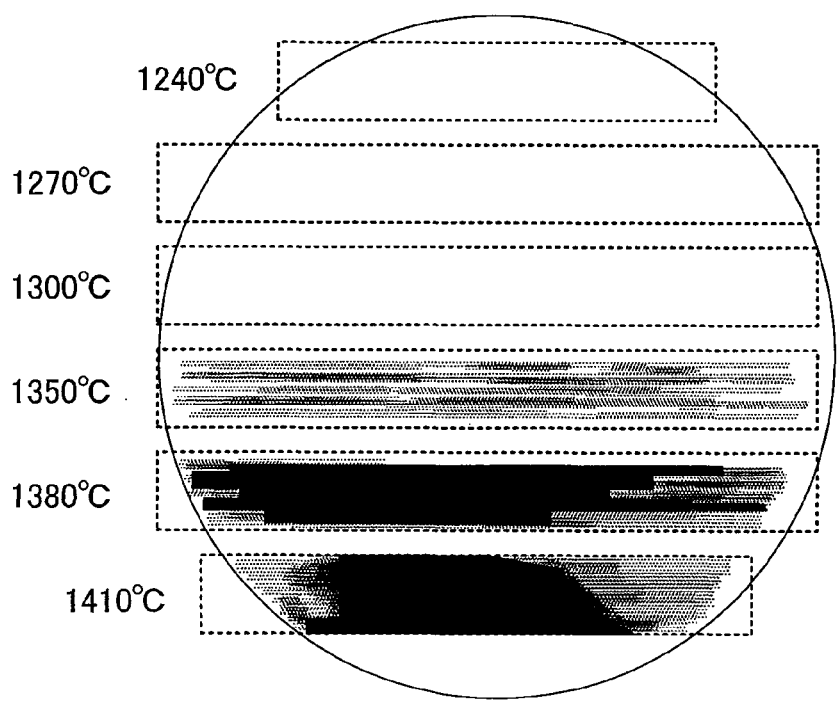
FIG. 8B shows crystal defects (black portions in the figure) occurring in an SiGe layer when a silicon substrate on which the SiGe layer has epitaxially grown is subjected to millisecond annealing at various thermal process temperatures.

FIG. 8B shows crystal defects (black portions in the figure) occurring in an SiGe layer whose Ge concentration is 20 atm % and whose thickness is 80 nm when a silicon substrate on which the SiGe layer has epitaxially grown is subjected to millisecond annealing at various temperatures up to 1410° C. As shown in FIG. 8B, crystal defects are observed in the SiGe layer as the thermal process temperature becomes 1350° C. or more, indicating that an SiGe layer is not resistant to a high-temperature process. Thus, with a material with a poor thermal resistance such as SiGe, simply increasing the thermal process temperature induces crystal defects and does not necessarily improve the activation rate. In view of this, one way of preventing crystal defects from occurring even with such a material with a poor thermal resistance is to further shorten the holding period for holding the temperature at a high thermal process temperature. However, this is not practical, as it will then be necessary to dramatically increase the energy density required for the light source. Moreover, it is not clear how much the holding period needs to be shortened in order to prevent crystal defects from occurring. Thus, by successively performing a plurality of iterations of the thermal cycle at a thermal process temperature, which has been lowered so that no crystal defects will occur, as in the present embodiment, it is possible to most efficiently realize a high activation rate. Specifically, where the thermal process temperature used when millisecond annealing including a single thermal cycle is performed is denoted as T4 and the thermal process temperature holding period is denoted as t4, the thermal process temperature T2 in a case where millisecond annealing including a plurality of thermal cycles is performed is a temperature that satisfies T2≦T4 and such that no crystal defects will occur, and the holding period t2 in such a case is determined so as to satisfy t4/N≦t2≦t4 where N is the number of iterations of the thermal cycle. Then, it is possible to obtain a higher activation rate by performing millisecond annealing including a plurality of thermal cycles than that when performing millisecond annealing including a single thermal cycle.

As described above, with the thermal cycle being repeated in a plurality of iterations as in the present embodiment, it is possible to maintain a high impurity activation rate without increasing the impurity diffusion length even when performing millisecond annealing on a material such as SiGe whose thermal resistance is lower than that of silicon. With a silicon material, it is possible to realize without crystal defects an impurity activation rate equal to or greater than that when a thermal process is performed at a high temperature close to the melting point of silicon, without increasing the thermal process temperature to be close to the melting point of silicon.

In other words, according to the present embodiment, it is possible to improve the impurity activation rate without thermally damaging the silicon substrate or the pattern formed thereon and without increasing the impurity diffusion length. Therefore, it is possible to reduce the resistance of the source/drain region and that of the extension region in the transistor structure, without increasing the diffusion length or the diffusion depth, whereby it is possible to improve the transistor performance while suppressing the short channel.

Moreover, according to the present embodiment, it is possible to suppress the damage to a device due to thermal stress or thermal fusion even with a device including a material such as SiGe whose thermal resistance is lower than that of silicon, and it is possible to improve the impurity activation rate without increasing the impurity diffusion length, whereby it is possible to improve the transistor performance.

Figure 9:
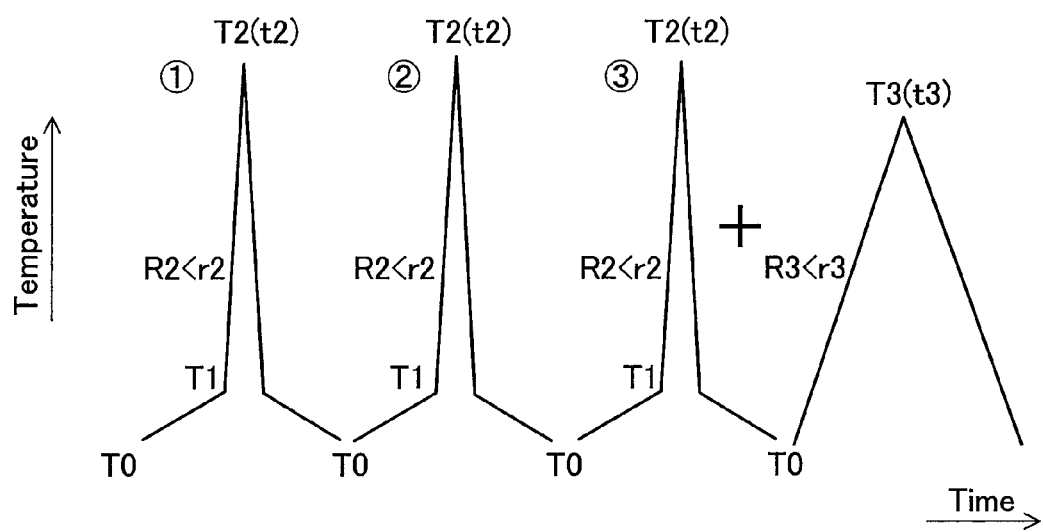
FIG. 9 shows an example of a temperature sequence in an impurity-activating thermal process method according to a variation of the second embodiment of the present invention.

While spike RTA was performed before millisecond annealing including a plurality of thermal cycles in the present embodiment as shown in the temperature sequence of FIG. 5, spike RTA may be performed after performing millisecond annealing including a plurality of thermal cycles as shown in the temperature sequence of FIG. 9. Alternatively, spike RTA may be performed before and after millisecond annealing including a plurality of thermal cycles. The spike RTA may be replaced by RTA. The thermal process temperature of spike RTA or RTA (the third predetermined temperature T3) is lower than the thermal process temperature of millisecond annealing (the second predetermined temperature T2). For example, the second predetermined temperature T2 (° C.) is 1100° C. to 1400° C., both inclusive, and the third predetermined temperature T3 (° C.) is 650° C. to 1150° C., both inclusive. Moreover, the holding period (the third holding period t3) at the third predetermined temperature T3 in spike RTA or RTA is longer than the holding period (the second holding period t2) in millisecond annealing. For example, the second holding period t2 is 50 msec or less, and the third holding period t3 is 50 msec to 1 sec, both inclusive. In spike RTA or RTA, the temperature-increasing rate up to the third predetermined temperature T3 and the temperature-decreasing rate from the third predetermined temperature T3 are 500° C./sec or less. Where spike RTA or RTA is performed before and after millisecond annealing including a plurality of thermal cycles, the third predetermined temperature T3 and the third holding period t3 in the spike RTA or RTA before millisecond annealing may be different from those in the spike RTA or RTA after millisecond annealing.

While the number of iterations of the thermal cycle is set to 2 or 3 in the present embodiment, the present invention is not limited thereto, but the number may be set to an arbitrary number from 2 to 5.

In the present embodiment, some or all of the thermal cycles may use different temperatures for the thermal process temperature (i.e., the second predetermined temperature T2).

While a beam scan-type laser (carbon dioxide gas laser) was used as the light source (heat source) of millisecond annealing in the present embodiment, a flash lamp, an arc lamp or a simultaneous irradiation-type pulsed laser may be used.

In the present embodiment, after every thermal cycle, the wafer was taken out of the thermal process apparatus after the temperature thereof was decreased from the first predetermined temperature T1 to the room temperature T0 being the final temperature, after which the following thermal cycle was performed successively starting from the room temperature T0 being the initial temperature. Alternatively, in order to shorten the process time, the second and subsequent thermal cycles may be performed starting from the first predetermined temperature T1. Specifically, in the first iteration of the thermal cycle, the temperature-decreasing process may end at the first predetermined temperature T1; in the second and subsequent iterations of the thermal cycle, excluding the final iteration, the temperature-increasing process may start from the first predetermined temperature T1 and the temperature-decreasing process may end at the first predetermined temperature T1; and in the final iteration of the thermal cycle, the temperature-increasing process may start from the first predetermined temperature T1 (° C.) and the temperature-decreasing process may end at the room temperature T0 being the final temperature.

Third Embodiment

A thermal process apparatus according to a third embodiment of the present invention, more specifically a thermal process apparatus for carrying out the impurity-activating thermal process method of the first and second embodiments, will now be described with reference to the drawings with respect to a case where a flash lamp (e.g., an Xe flash lamp) is used as the heat source.

Figure 10A:
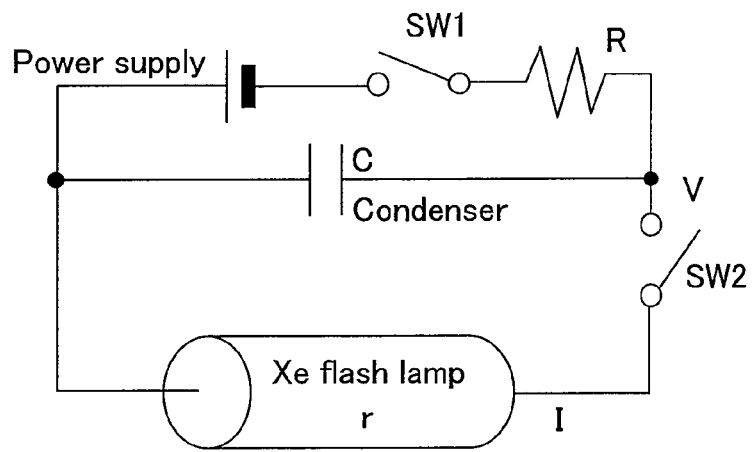
FIG. 10A is a circuit diagram showing a general configuration of a millisecond annealing apparatus of a comparative example.
Figure 10B:
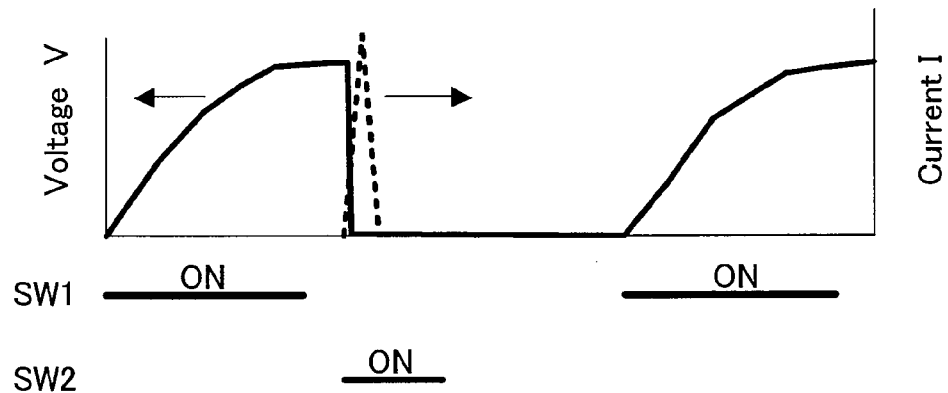
FIG. 10B illustrates an operation thereof.

First, a millisecond annealing apparatus using an ordinary flash lamp (a millisecond annealing apparatus of a comparative example) will be described with reference to FIGS. 10A and 10B. FIG. 10A is a circuit diagram showing a general configuration of the millisecond annealing apparatus of the comparative example, and FIG. 10B illustrates an operation thereof. As shown in FIG. 10A, the millisecond annealing apparatus of the comparative example includes a condenser (the capacitance C) and a Xe flash lamp (the internal resistance r) connected in parallel to each other and to the power supply. A switch SW1 and a serial resistor R are provided in series between the power supply and the condenser, and the switch SW1, the serial resistor R and a switch SW2 are provided in series between the power supply and the Xe flash lamp (the internal resistance r). As shown in FIG. 10B, when flashing the flash lamp, the switch SW1 connected to the power supply is first turned ON to once charge the condenser (the capacitance C). Then, the switch SW1 is turned OFF, and the switch SW2 connected to the flash lamp is turned ON to thereby send at once the charge stored in the condenser to the flash lamp. Specifically, the power supply is connected to the condenser during the charging operation, and the condenser is connected to the flash lamp while flashing the flash lamp. Therefore, the holding period for holding the temperature at the peak temperature of the thermal cycle is determined by the capacitance C of the condenser and the internal resistance r of the flash lamp. A variable resistor vr may be provided in series with the flash lamp in order to control the amount of time for which the flash lamp flashes. In other words, by varying the resistance value of the variable resistor vr, it is possible to vary the holding period for holding the temperature at the peak temperature of the thermal cycle.

Figure 11A:
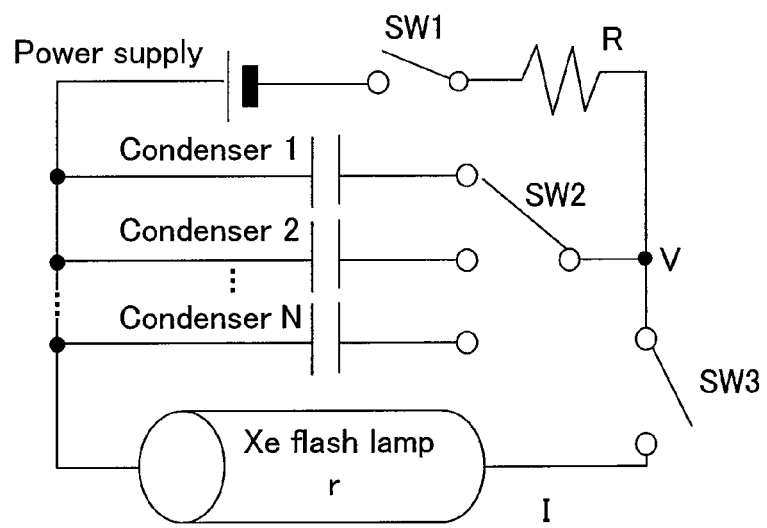
FIG. 11A is a circuit diagram showing a general configuration of a millisecond annealing apparatus according to a third embodiment of the present invention.
Figure 11B:
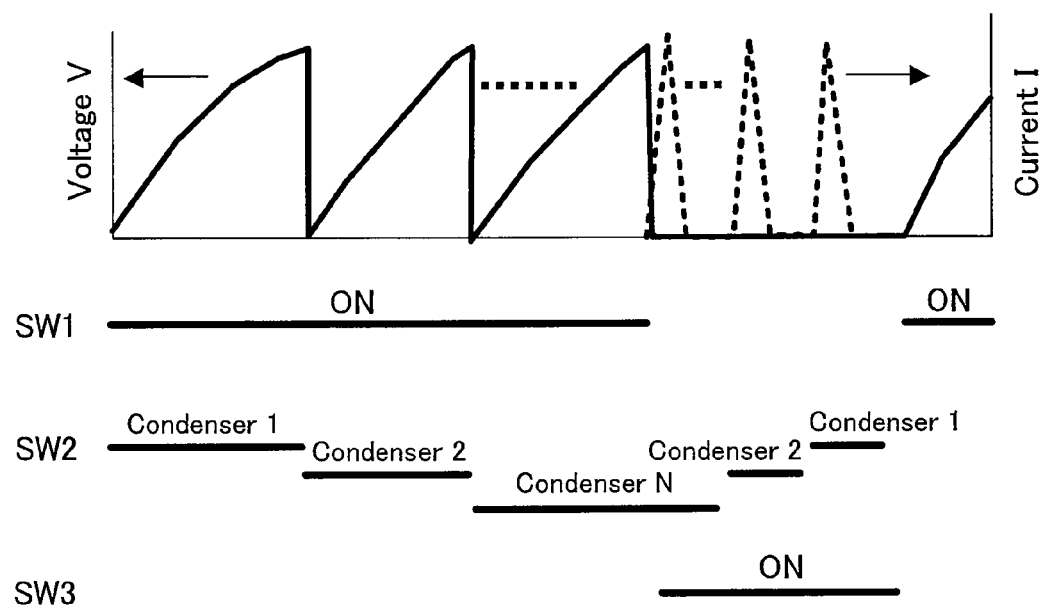
FIG. 11B illustrates an operation thereof.

FIG. 11A is a circuit diagram showing a general configuration of a millisecond annealing apparatus of the present embodiment, and FIG. 11B illustrates an operation thereof. As shown in FIG. 11A, in the millisecond annealing apparatus of the present embodiment, a plurality (N) of condensers and an Xe flash lamp (the internal resistance r) are connected in parallel to each other and to the power supply. The switch SW1, the serial resistor R and the switch SW2 are provided in series between the power supply and the condensers, and the switch SW1, the serial resistor R and a switch SW3 are connected in series between the power supply and the Xe flash lamp (the internal resistance r). As shown in FIG. 11B, when flashing the flash lamp, the switch SW1 connected to the power supply is first turned ON, and the switch SW2 is switched from one position to another, thereby successively charging the plurality of condensers from the power supply. Then, the switch SW1 is turned OFF, the switch SW3 connected to the flash lamp is turned ON, and the switch SW2 is switched from one position to another, thereby sending the charge successively from different condensers to the flash lamp. Thus, it is possible to successively perform a number of iterations (equal to the number of condensers) of flash lamp annealing.

An impurity-activating thermal process method using a thermal process apparatus of the present embodiment shown in FIGS. 11A and 11B, more specifically an example of a method for forming a MOS transistor using millisecond annealing for impurity activation, will now be described. Steps of the method for forming a MOS transistor are the same as those of the first embodiment shown in FIGS. 1A to 1C. In the present embodiment, after the steps shown in FIGS. 1A and 1B, an impurity-activating thermal process is performed using the above thermal process apparatus (the number of condensers: three) of the present embodiment in the step shown in FIG. 1C. Before performing millisecond annealing using the thermal process apparatus of the present embodiment, a hot plate is used to increase the temperature of the silicon wafer to be heated from the room temperature (the term "room temperature" as used herein includes temperatures around room temperature) T0 being the initial temperature to the first predetermined temperature T1 of 450° C. and then hold the temperature at 450° C. Then, through a first flash lamp irradiation using the thermal process apparatus of the present embodiment, the temperature of the silicon wafer is increased from the first predetermined temperature T1 (° C.) of 450° C. to the second predetermined temperature T2 (° C.) of 1310° C. at a second temperature-increasing rate R2 (° C./sec) less than or equal to the maximum rate r2 (e.g., $1.0 \times 10^6$ (° C./sec)), after which the temperature is held at the second predetermined temperature T2 (° C.) of 1310° C. for the second holding period t2 (sec) of 1 msec, for example. Then, the temperature of the silicon wafer is decreased from the second predetermined temperature T2 (° C.) of 1310° C. to the first predetermined temperature T1 (° C.) of 450° C. at the first temperature-decreasing rate R1' (° C./sec) less than or equal to the maximum rate r1' (e.g., $1.0 \times 10^6$ (° C./sec)). Then, a second flash lamp irradiation is performed as the second thermal cycle similar to the first thermal cycle as described above is performed, and then a third flash lamp irradiation is performed as the third thermal cycle similar to the first thermal cycle as described above, after which the temperature of the silicon wafer is decreased to the first predetermined temperature T1 (° C.) of 450° C. and is then decreased from the first predetermined temperature T1 (° C.) of 450° C. to the room temperature T0 being the final temperature at the arbitrary second temperature-decreasing rate R2' (° C./sec).

The millisecond annealing apparatus of the comparative example shown in FIG. 10A may include a plurality of flash lamps but it includes only one condenser, and it is not possible to successively perform a plurality of flash lamp irradiations, whereby the silicon wafer needs to be taken out of the thermal process apparatus after every flash lamp irradiation before it is subjected to the following flash lamp irradiation. In contrast, with the thermal process apparatus of the present embodiment shown in FIG. 11A, it is possible to successively discharge the flash lamp by switching the plurality of condensers from one to another, and it is possible to perform millisecond annealing including a plurality of thermal cycles.

In the case of a flash lamp, typically, the thermal process temperature holding period is determined by the capacitance (C) of the condenser and the internal resistance (serial resistance) r of the flash lamp. Therefore, varying the thermal process temperature holding period by varying the serial resistance r is not easy, as compared with laser irradiation. Also when shortening the thermal process temperature holding period in order to prevent crystal defects, it is not easy to change the holding period. In contrast, successively performing a plurality of iterations of flash lamp irradiation with lowering of the thermal process temperature, as in the present embodiment, is advantageous in that productivity can be made very high while maintaining or improving the activation rate.

As described above, according to the third embodiment, a device can be subjected to millisecond annealing including a plurality of thermal cycles without sacrificing productivity using a so-called "flash annealing" where a flash lamp is used as the heat source, whereby it is possible to improve the impurity activation rate and to realize a high-performance transistor.

While millisecond annealing is performed using a flash lamp in the third embodiment, it is possible to obtain similar effects to those of the present embodiment by employing a similar configuration to that of the present embodiment also in a case where millisecond annealing is performed using an arc lamp. Also in laser annealing in which the entire surface of the wafer is irradiated with a laser beam by repeating a step and repeat operation while simultaneously irradiating a predetermined zone with the laser beam using a pulsed laser such as an excimer laser, similar effects to those of the present embodiment can be obtained by employing a configuration where a short-time pulse irradiation is successively performed in a plurality of iterations.

Fourth Embodiment

A thermal process apparatus according to a fourth embodiment of the present invention, more specifically a thermal process apparatus for carrying out the impurity-activating thermal process method (i.e., millisecond annealing including a plurality of thermal cycles) of the first and second embodiments, will now be described with reference to the drawings.

Figure 12:
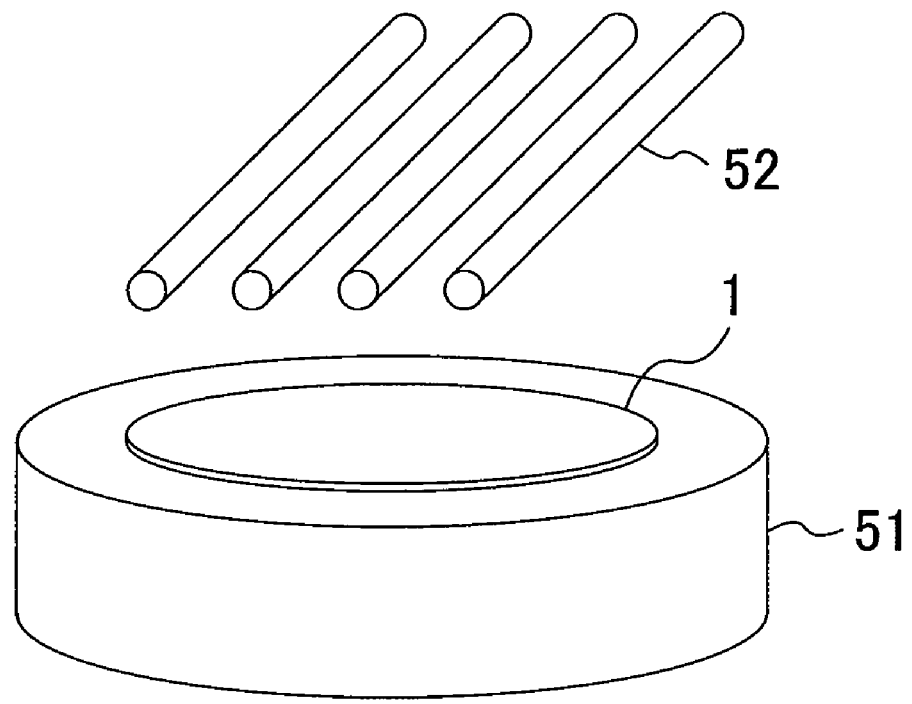
FIG. 12 shows a general configuration of a millisecond annealing apparatus according to a fourth embodiment of the present invention.
Figure 13A:
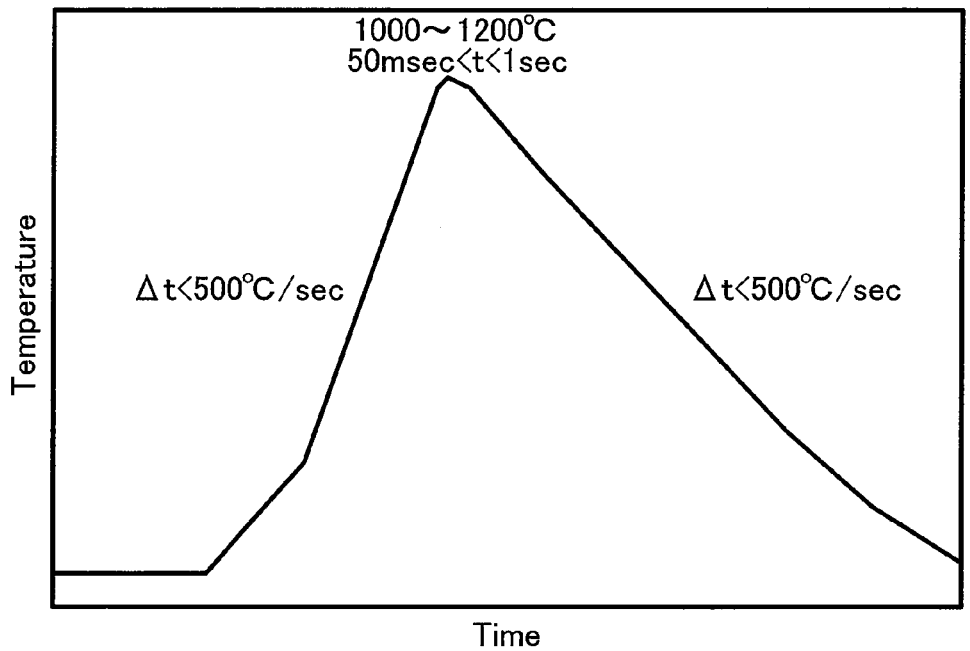
FIG. 13A shows an example of a temperature sequence of a conventional spike RTA.
Figure 13B:
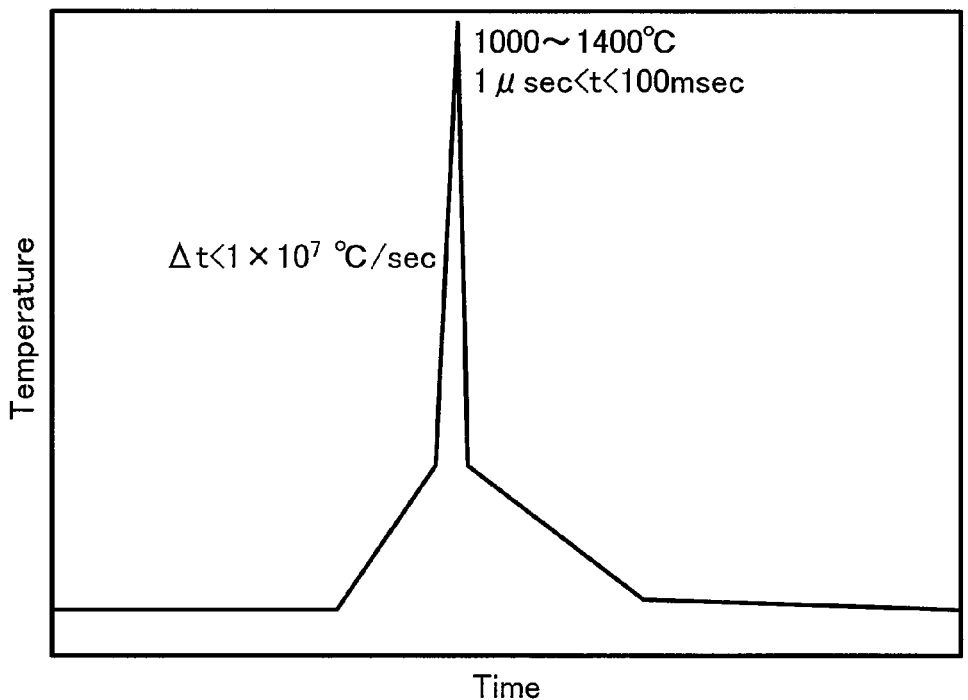
FIG. 13B shows an example of a temperature sequence of a conventional millisecond annealing.

FIG. 12 shows a general configuration of the millisecond annealing apparatus of the present embodiment. As shown in FIG. 12, the millisecond annealing apparatus of the present embodiment includes, within the same chamber (not shown), a hot plate 51 for heating the silicon substrate (silicon wafer) 1 to a first predetermined temperature T1 (° C.) of about 400° C., for example, and a plurality of flash lamps 52 for heating the silicon wafer 1 to a second predetermined temperature T2 (° C.) of about 1310° C., for example. The silicon wafer 1 is placed on the hot plate 51. Each flash lamp 52 is the lamp portion of the millisecond annealing apparatus of the third embodiment shown in FIG. 11A.

Thus, with the millisecond annealing apparatus of the present embodiment, the impurity-activating thermal process method of the first and second embodiments can be carried out with the silicon wafer 1 left on the hot plate 51.

While millisecond annealing is performed using a flash lamp 52 in the fourth embodiment, it is possible to obtain similar effects to those of the present embodiment by employing a similar configuration to that of the present embodiment also in a case where millisecond annealing is performed using an arc lamp. A laser such as a beam scan-type laser or a simultaneous irradiation-type pulsed laser may be provided instead of the flash lamps 52. A heating mechanism based on light radiation (e.g., a lamp) may be provided instead of the hot plate 51. In such a case, however, a mechanism for holding the silicon wafer 1 needs to be provided separately.

What is claimed is:

1. An impurity-activating thermal process method, wherein a thermal cycle is successively repeated in a plurality of iterations in an impurity-activating thermal process after a target is subjected to an impurity introduction step, wherein each thermal cycle includes: increasing a temperature from an initial temperature to a first predetermined temperature T1 (° C.) at an arbitrary first temperature-increasing rate R1 (° C./sec); holding the temperature at the first predetermined temperature T1 (° C.) for an arbitrary first holding period t1 (sec); increasing the temperature from the first predetermined temperature T1 (° C.) to a second predetermined temperature T2 (° C.) at a second temperature-increasing rate R2 (° C./sec) of $1.0 \times 10^7$ (° C./sec) or less; holding the temperature at the second predetermined temperature T2 (° C.) for a second holding period t2 (sec) of 50 msec or less; decreasing the temperature from the second predetermined temperature T2 (° C.) to the first predetermined temperature T1 (° C.) at a first temperature-decreasing rate R1' (° C./sec) of $1.0 \times 10^7$ (° C./sec) or less; holding the temperature at the first predetermined temperature T1 (° C.) for an arbitrary third holding period t3 (sec); and decreasing the temperature from the first predetermined temperature T1 (° C.) to a final temperature at an arbitrary second temperature-decreasing rate R2' (° C./sec), a beam scan-type laser is used as a heat source in the activation thermal process, the target includes SiGe, and an overlap of the beam of the laser is increased to thereby increase the number of times a same location of the target is irradiated with the laser beam.

2. The impurity-activating thermal process method of claim 1, comprising, before performing the activation thermal process:

forming an isolation region on a substrate including SiGe being the target; subjecting the substrate to an impurity introduction for threshold control; forming a gate electrode on the substrate with a gate insulating film interposed therebetween; forming an offset spacer on a sidewall of the gate electrode; implanting ions of an impurity into the substrate using the gate electrode and the offset spacer as a mask to thereby form an extension region; performing a first activation thermal process for activating the impurity in the extension region; forming a sidewall spacer on the sidewall of the gate electrode with the offset spacer interposed therebetween; and implanting ions of an impurity into the substrate using the gate electrode, the offset spacer and the sidewall spacer as a mask to thereby form a source/drain region.

3. The impurity-activating thermal process method of claim 1, wherein:

the first predetermined temperature T1 (° C.) is 400° C. to 800° C., both inclusive; and the second predetermined temperature T2 (° C.) is 1100° C. to 1400° C., both inclusive.

4. The impurity-activating thermal process method of claim 1, wherein:

in a first iteration of the thermal cycle, the temperature-decreasing process ends at the first predetermined temperature T1 (° C.);

in a second or subsequent iteration, excluding a final iteration, of the thermal cycle, the temperature-increasing process starts at the first predetermined temperature T1 (° C.) and the temperature-decreasing process ends at the first predetermined temperature T1 (° C.); and in the final iteration of the thermal cycle, the temperature-increasing process starts at the first predetermined temperature T1 (° C.) and the temperature-decreasing process ends at the final temperature.

5. The impurity-activating thermal process method of claim 1, wherein the number of iterations of the thermal cycle is 2 to 5.

6. The impurity-activating thermal process method of claim 1, wherein at least either before or after the activation thermal process, another thermal process is performed by holding the temperature at a third predetermined temperature T3 (° C.) lower than the second predetermined temperature T2 (° C.) for a third holding period t3 (sec) longer than the second holding period t2 (sec).

7. The impurity-activating thermal process method of claim 6, wherein:

the other thermal process is performed both before and after the activation thermal process; and the third predetermined temperature T3 (° C.) and the third holding period t3 (sec) in the other thermal process performed before the activation thermal process are different from those in the other thermal process performed after the activation thermal process.

8. The impurity-activating thermal process method of claim 6, wherein:

a temperature-increasing rate up to the third predetermined temperature T3 (° C.) in the other thermal process and a temperature-decreasing rate from the third predetermined temperature T3 (° C.) in the other thermal process are 500° C./sec or less; and the third holding period t3 (sec) is 50 msec to 1 sec, both inclusive.

9. The impurity-activating thermal process method of claim 6, wherein:

the second predetermined temperature T2 (° C.) is 1100° C. to 1400° C., both inclusive; and the third predetermined temperature T3 (° C.) is 650° C. to 1150° C., both inclusive.

10. The impurity-activating thermal process method of claim 1, wherein:
performing the thermal cycle in a plurality of iterations by scanning the target with a beam of the laser.

11. The impurity-activating thermal process method of claim 1, wherein at least one of the initial temperature and the final temperature is room temperature or a vicinity thereof.

* * * * *